United States Patent
Ito et al.

(10) Patent No.: US 7,268,036 B2
(45) Date of Patent: Sep. 11, 2007

(54) SEMICONDUCTOR DEVICE AND METHOD FOR FABRICATING THE SAME

(75) Inventors: Toyoji Ito, Shiga (JP); Eiji Fujii, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 344 days.

(21) Appl. No.: 10/999,977

(22) Filed: Dec. 1, 2004

(65) Prior Publication Data

US 2005/0101085 A1    May 12, 2005

Related U.S. Application Data

(62) Division of application No. 10/335,858, filed on Jan. 3, 2003, now Pat. No. 6,831,323.

(30) Foreign Application Priority Data

Mar. 28, 2002   (JP)   .............................. 2002-091298

(51) Int. Cl.
*H01L 21/8242* (2006.01)
(52) U.S. Cl. ...................... 438/243; 438/244; 438/253; 257/E21.008
(58) Field of Classification Search ................ 438/244, 438/243, 253, 386, 387, 396, 397
See application file for complete search history.

(56) References Cited

U.S. PATENT DOCUMENTS

| | | | |
|---|---|---|---|
| 6,004,856 A | 12/1999 | Mazure-Espejo et al. | |
| 6,040,215 A | 3/2000 | Takaishi | |
| 6,177,284 B1 | 1/2001 | Horii et al. | |
| 6,180,447 B1 | 1/2001 | Park et al. | |
| 6,232,174 B1 | 5/2001 | Nagata et al. | |
| 6,239,461 B1 | 5/2001 | Lee | |
| 6,284,595 B1 | 9/2001 | Kato | |
| 6,297,527 B1 | 10/2001 | Agarwal et al. | |
| 6,335,241 B1 * | 1/2002 | Hieda et al. ................. | 438/253 |
| 6,421,223 B2 | 7/2002 | Marsh | |
| 6,599,806 B2 | 7/2003 | Lee | |
| 6,660,580 B2 | 12/2003 | Lee | |

(Continued)

FOREIGN PATENT DOCUMENTS

JP        09-331038        12/1997

(Continued)

OTHER PUBLICATIONS

Notice of Reasons for Rejection, dated Jun. 6, 2006 of 2004-031024, 9 pages.

*Primary Examiner*—Michael Trinh
(74) *Attorney, Agent, or Firm*—McDermott Will & Emery LLP

(57) ABSTRACT

A semiconductor device includes: a conductive plug formed through an insulating film; a conductive oxygen barrier film formed on the insulating film so as to be electrically connected to the conductive plug and to cover the conductive plug; a lower electrode formed on the oxygen barrier film and connected to the oxygen barrier film; a capacitive insulating film formed on the lower electrode, following the lower electrode; and an upper electrode formed on the capacitive insulating film, following the capacitive insulating film. The capacitive insulating film has a bent portion that extends along the direction in which the conductive plug penetrates through the insulating film.

16 Claims, 19 Drawing Sheets

U.S. PATENT DOCUMENTS

| | | |
|---|---|---|
| 6,682,969 B1 | 1/2004 | Basceri et al. |
| 2002/0037624 A1 | 3/2002 | Mori et al. |
| 2002/0061604 A1 | 5/2002 | Sitaram et al. |
| 2002/0102791 A1 | 8/2002 | Karusawa et al. |
| 2002/0165615 A1 | 11/2002 | Abouaf et al. |

FOREIGN PATENT DOCUMENTS

| | | |
|---|---|---|
| JP | 11-265984 | 9/1999 |
| JP | 11-307735 | 11/1999 |
| JP | 2000-22109 A | 1/2000 |
| JP | 2000-68471 A | 3/2000 |
| JP | 2000-124426 A | 4/2000 |
| JP | 2000-216362 A | 8/2000 |
| JP | 2000-228506 | 8/2000 |
| JP | 2000-315779 A | 11/2000 |
| JP | 2001-77326 | 3/2001 |
| JP | 2001-85640 | 3/2001 |
| JP | 2001-223345 A | 8/2001 |
| JP | 2001-250925 A | 9/2001 |
| JP | 2001-267535 A | 9/2001 |
| JP | 2002-9259 A | 1/2002 |
| JP | 2002-57299 A | 2/2002 |
| JP | 2002-57306 A | 2/2002 |
| JP | 2002-76290 A | 3/2002 |
| JP | 2002-76293 A | 3/2002 |
| WO | WO 01/84605 A1 | 9/2001 |

* cited by examiner

SEMICONDUCTOR DEVICE AND METHOD FOR FABRICATING THE SAME

RELATED APPLICATION

This application is a divisional of U.S. patent application Ser. No. 10/335,858, filed Jan. 3, 2003, now U.S. Pat. No. 6,831,323.

BACKGROUND OF THE INVENTION

The present invention relates to semiconductor devices including capacitors, especially capacitors in which ferroelectrics or high-κ materials are used for capacitive insulating films, and methods for fabricating the same.

Ferroelectrics or high-κ materials exhibit remanent polarization due to hysteresis properties or high relative dielectric constants. Thus, in the field of nonvolatile memories or DRAM devices, the ferroelectrics or the high-κ materials can substitute for silicon oxide or silicon nitride used for capacitive insulating films included in capacitors of semiconductor devices.

Hereinafter, a known method for fabricating a semiconductor device including a capacitor in which a ferroelectric or a high-κ material is used for a capacitive insulating film will be described with reference to the drawings.

First, as shown in FIG. 19A, a transistor region 103 is defined by an isolation film 102 selectively formed in a semiconductor substrate 101 of silicon. Thereafter, an MOS transistor 104 is formed in the transistor region 103.

Next, as shown in FIG. 19B, a first interlevel dielectric film 105 of silicon dioxide is deposited, and then the surface thereof is planarized. Thereafter, a lower-electrode formation film of platinum is deposited by a sputtering process on the planarized first interlevel dielectric film 105. Subsequently, a ferroelectric film containing strontium, bismuth, tantalum and the like is formed by a spin-on process on the lower-electrode formation film. After the ferroelectric film has been crystallized, an upper-electrode formation film of platinum is deposited by a sputtering process on the ferroelectric film. Thereafter, the upper-electrode formation film, the ferroelectric film and the lower-electrode formation film are dry-etched in this order, thereby forming a lower electrode 106, a capacitive insulating film 107 and an upper electrode 108 out of the lower-electrode formation film, the ferroelectric film and the upper-electrode formation film, respectively, on part of the interlevel dielectric film 105 located over the isolation film 102. In this manner, a capacitor 109 made of the lower electrode 106, the capacitive insulating film 107 and the upper electrode 108 is formed.

Then, as shown in FIG. 19C, a second interlevel dielectric film 110 of silicon dioxide is deposited over the entire surface of the semiconductor substrate 101. Thereafter, a first contact hole 110a for exposing the upper electrode 108 therein and a second contact hole 110b for exposing a doped region of the MOS transistor 104 therein are formed in the second interlevel dielectric film 110.

Then, as shown in FIG. 19D, a metal film containing aluminum as a main component is deposited over the entire surface of the second interlevel dielectric film 110 including the contact holes 110a and 110b. The metal film is patterned, thereby forming a wiring 111 out of the metal film. Thereafter, another wiring layer and a passivation film, for example, are formed.

In the known method for fabricating a semiconductor device, however, the capacitor 109 is formed over the isolation film 102 adjacent to the transistor region 103.

In addition, since the capacitor 109 extends along the principal surface of the semiconductor substrate 101, i.e., has a so-called planar structure, the projected area of the capacitor 109 onto the substrate surface that is enough to ensure a required capacitance is large, resulting in the extremely small effect of reducing a wiring rule for the MOS transistor 104 and the wiring 111.

Therefore, especially the semiconductor device including the capacitor 109 in which a ferroelectric or a high-κ material is used for the capacitive insulating film 107 has a problem that the area of each capacitor, specifically the area of each cell in a semiconductor memory, cannot be reduced.

SUMMARY OF THE INVENTION

It is therefore an object of the present invention to reduce the area of each capacitor in a semiconductor device including a capacitor.

In order to achieve this object, according to the present invention, an oxygen barrier film, a lower electrode and a capacitive insulating film are stacked over a conductive plug, and in addition, the capacitive insulating film has a bent portion that extends along the direction of penetration of the conductive plug.

Specifically, a first inventive semiconductor device includes: a conductive plug formed through an insulating film; a conductive oxygen barrier film formed on the insulating film so as to be electrically connected to the conductive plug and to cover the conductive plug; a lower electrode formed on the oxygen barrier film and connected to the oxygen barrier film; a capacitive insulating film formed on the lower electrode, following the lower electrode; and an upper electrode formed on the capacitive insulating film, following the capacitive insulating film. The capacitive insulating film has a bent portion that extends along the direction in which the conductive plug penetrates through the insulating film.

In the first inventive semiconductor device, the capacitor made of the lower electrode, the capacitive insulating film and the upper electrode is formed over a transistor with the conductive plug sandwiched therebetween. Thus, the unit area of a cell constituted by the capacitor and the transistor is reduced. In addition, since the capacitive insulating film has the bent portion that extends along the direction of penetration of the conductive plug, the capacitive insulating film has a face substantially perpendicular to the substrate surface. Accordingly, the projected area of the capacitive insulating film onto the substrate surface is reduced, thus further reducing the cell area. Moreover, since the oxygen barrier film is interposed between the lower electrode and the conductive plug, the conductive plug is not oxidized by oxygen atoms constituting the capacitive insulating film.

A second inventive semiconductor device includes: a conductive plug formed through a first interlevel dielectric film formed on a substrate; a conductive oxygen barrier film formed on the first interlevel dielectric film so as to be electrically connected to the conductive plug and to cover the conductive plug; a second interlevel dielectric film formed on the first interlevel dielectric film and having an opening in which the oxygen barrier film is exposed; a lower electrode formed to follow bottom and wall surfaces of the opening formed in the second interlevel dielectric film and to be connected to the oxygen barrier film; a capacitive insulating film formed on the lower electrode, following the lower electrode; and an upper electrode formed on the capacitive insulating film, following the capacitive insulating film. The capacitive insulating film has contiguous portions located over the bottom and wall surfaces of the opening, respectively, to form a U-bent portion that extends along the direction in which the conductive plug penetrates through the first interlevel dielectric film.

In the second inventive semiconductor device, the lower electrode is formed to follow the bottom and wall surfaces of the opening formed in the second interlevel dielectric film. Thus, a U-bent portion extending along the direction of penetration of the conductive plug is formed in contiguous portions located over the wall and bottom surfaces of the opening. Accordingly, the capacitive insulating film has a face substantially perpendicular to the substrate surface. As a result, the same effect as in the first inventive semiconductor device is obtained.

The second inventive semiconductor device may include an adhesion layer that enhances the adhesion of the lower electrode to the second interlevel dielectric film and is interposed between the bottom surface of the opening and the lower electrode and between the wall surface of the opening and the lower electrode.

Alternatively, the second inventive semiconductor device may include an adhesion layer that enhances the adhesion of the lower electrode to the second interlevel dielectric film and is interposed between the wall of the opening and the lower electrode.

In such a case, the adhesion layer is preferably made of a metal oxide

A third inventive semiconductor device includes: a conductive plug formed through an interlevel dielectric film formed on a substrate; a conductive oxygen barrier film formed on the interlevel dielectric film so as to be electrically connected to the conductive plug and to cover the conductive plug; a lower electrode having a relatively large thickness and formed on the oxygen barrier film so as to be connected to the oxygen barrier film and to cover the oxygen barrier film; a capacitive insulating film formed on upper and side surfaces of the lower electrode; and an upper electrode formed on the capacitive insulating film, following the capacitive insulating film. The capacitive insulating film has contiguous portions located over the upper and side surfaces of the lower electrode, respectively, to form an inverted U-bent portion that extends along the direction in which the conductive plug penetrates the interlevel dielectric film.

In the third inventive semiconductor device, the conductive plug, the oxygen barrier film and the lower electrode are stacked, and the capacitive insulating film is formed on the upper and side surfaces of the lower electrode having a relatively large thickness. Thus, an inverted U-bent portion extending along the direction of penetration of the conductive plug is formed in contiguous portions located over the upper and side surfaces of the lower electrode. Accordingly, the capacitive insulating film has a face substantially perpendicular to the substrate surface. As a result, the same effect as in the first inventive semiconductor device is obtained.

A fourth inventive semiconductor device includes: a conductive plug formed through an interlevel dielectric film formed on a substrate; a conductive oxygen barrier film formed on the interlevel dielectric film so as to be electrically connected to the conductive plug and to cover the conductive plug; an underlying film formed on the oxygen barrier film and having a relatively large thickness; a lower electrode formed on upper and side surfaces of the underlying film, an end portion of the lower electrode being connected to the oxygen barrier film; a capacitive insulating film formed on the lower electrode, following the lower electrode; and an upper electrode formed on the capacitive insulating film, following the capacitive insulating film. The capacitive insulating film has contiguous portions located over the upper and side surfaces of the underlying film, respectively, to form an inverted U-bent portion that extends along the direction in which the conductive plug penetrates through the interlevel dielectric film.

In the fourth inventive semiconductor device, the lower electrode is formed on the upper and side surfaces of the underlying film, and the capacitive insulating film is formed to follow the lower electrode. Thus, an inverted U-bent portion extending along the direction of penetration of the conductive plug is formed in contiguous portions located over the upper and side surfaces of the underlying film. Accordingly, the capacitive insulating film has a face substantially perpendicular to the substrate surface. As a result, the same effect as in the first inventive semiconductor device is obtained.

The fourth inventive semiconductor device preferably includes an adhesion layer that enhances the adhesion of the lower electrode to the underlying film and is interposed between the underlying film and the lower electrode.

In such a case, the adhesion layer is preferably made of a metal oxide.

A fifth inventive semiconductor device includes: a conductive plug formed through an interlevel dielectric film formed on a substrate; a conductive oxygen barrier film formed on the interlevel dielectric film so as to be electrically connected to the conductive plug and to cover the conductive plug; a lower electrode in the shape of a bottomed cylinder formed on the oxygen barrier film to be connected to the oxygen barrier film; a capacitive insulating film formed on the lower electrode, following the bottom surface of, and sidewall inner and outer surfaces of, the lower electrode; and an upper electrode formed on the capacitive insulating film, following the capacitive insulating film. The capacitive insulating film has at least contiguous portions located over the bottom of, and the sidewall inner wall surface of, the lower electrode, respectively, to form a U-bent portion that extends along the direction in which the conductive plug penetrates through the interlevel dielectric film.

In the fifth inventive semiconductor device, a U-bent portion extending along the direction of penetration of the conductive plug is formed in contiguous portions located over the bottom and sidewall inner surface of the lower electrode. Accordingly, the capacitive insulating film has a face substantially perpendicular to the substrate surface. As a result, the same effect as in the first inventive semiconductor device is obtained. In addition, the lower electrode has the shape of a bottomed cylinder. Thus, the sidewall outer surface of the lower electrode increases the area in which the lower electrode faces the upper electrode, thereby increasing the capacitance significantly.

A sixth inventive semiconductor device includes: a conductive plug formed through an interlevel dielectric film formed on a substrate; a conductive oxygen barrier film formed on the interlevel dielectric film so as to be electrically connected to the conductive plug and to cover the conductive plug; a shape-sustaining film in the shape of a bottomed cylinder formed on the oxygen barrier film; a lower electrode formed on the shape-sustaining film, following the bottom surface of, and sidewall inner and outer surfaces of, the shape-sustaining film, an end portion of the lower electrode being connected to the oxygen barrier film; a capacitive insulating film formed on the lower electrode, following the lower electrode; and an upper electrode formed on the capacitive insulating film, following the capacitive insulating film. The capacitive insulating film has at least contiguous portions located over the bottom and sidewall inner surfaces of the shape-sustaining film, respectively, to form a U-bent portion that extends along the direction in which the conductive plug penetrates through the interlevel dielectric film.

In the sixth inventive semiconductor device, the lower electrode is formed on the shape-sustaining film in the shape of a bottomed cylinder formed on the oxygen barrier film, so that the lower electrode follows the bottom surface and the sidewall inner and outer surfaces of the shape-sustaining film. In addition, the capacitive insulating film is formed to follow the lower electrode. Thus, a U-bent portion extending along the direction of penetration of the conductive plug is formed at least in contiguous portions located over the bottom and sidewall inner surfaces of the shape-sustaining film. Accordingly, the capacitive insulating film has a face substantially perpendicular to the substrate surface. As a result, the same effect as in the first inventive semiconductor device is obtained. In addition, the shape-sustaining film having the shape of a bottomed cylinder is used. Thus, the capacitance increases, while the shape of the lower electrode is stabilized.

In such a case, the shape-sustaining film is preferably made of a metal oxide.

In the first through sixth inventive semiconductor devices, the capacitive insulating film is preferably made of a ferroelectric or a high-dielectric-constant material.

A first inventive method for fabricating a semiconductor device includes the steps of: a) forming a first interlevel dielectric film on a semiconductor region; b) forming, in the first interlevel dielectric film, a conductive plug connected to the semiconductor region; c) forming a conductive oxygen barrier film on the first interlevel dielectric film such that the conductive oxygen barrier film covers the conductive plug; d) forming, on the first interlevel dielectric film, a second interlevel dielectric film having an opening in which the oxygen barrier film is exposed; e) forming a lower electrode on bottom and wall surfaces of the opening formed in the second interlevel dielectric film such that the lower electrode is connected to the oxygen barrier film; f) forming a capacitive insulating film on the lower electrode such that the capacitive insulating film follows the lower electrode; and g) forming an upper electrode on the capacitive insulating film such that the upper electrode follows the capacitive insulating film.

In the first inventive method, a capacitive insulating film has a face substantially perpendicular to the substrate surface over the wall surface of an opening formed in a second interlevel dielectric film. Thus, it is possible to reduce the projected area of a capacitor onto the substrate surface, while ensuring a required capacitance. In addition, a lower electrode is formed on the bottom and wall surfaces of the opening in the second interlevel dielectric film. Thus, the thickness of the lower electrode can be easily reduced, thus ensuring a large surface area of the lower electrode. Furthermore, since an oxygen barrier film is formed independently of the lower electrode, the oxygen barrier film can be made relatively thick. Thus, even if the capacitive insulating film is made of a ferroelectric or a high-dielectric-constant material, the conductive plug is not oxidized during crystallization of the ferroelectric or the like through heat treatment.

In the first inventive method, the step e) preferably includes the step of removing part of the lower electrode located on the second interlevel dielectric film by, for example, a CMP process or a resist etch back process.

The first inventive method may include the steps of forming, on parts of the second interlevel dielectric film respectively located on the bottom and wall surfaces of the opening, an adhesion layer that is connected to the oxygen barrier film and enhances the adhesion of the lower electrode to the second interlevel dielectric film, between the steps of d) and e).

Alternatively, the first inventive method may include the step of forming, on part of the second interlevel dielectric film located on the wall of the opening, an adhesion layer that enhances the adhesion of the lower electrode to the second interlevel dielectric film, between the steps of d) and e).

In such a case, the adhesion layer is preferably made of a metal oxide.

A second inventive method for fabricating a semiconductor device includes the steps of: a) forming a first interlevel dielectric film on a semiconductor region; b) forming, in the first interlevel dielectric film, a conductive plug connected to the semiconductor region; c) forming, on the first interlevel dielectric film, a second interlevel dielectric film having a first opening in which the conductive plug is exposed; d) forming a conductive oxygen barrier film in the first opening such that the conductive oxygen barrier film fills in the first opening; e) forming, on the second interlevel dielectric film, a third interlevel dielectric film having a second opening in which the oxygen barrier film is exposed; f) forming a lower electrode on bottom and wall surfaces of the second opening formed in the third interlevel dielectric film such that the lower electrode is connected to the oxygen barrier film; g) forming a capacitive insulating film on the lower electrode such that the capacitive insulating film follows the lower electrode; and h) forming an upper electrode on the capacitive insulating film such that the upper electrode follows the capacitive insulating film.

In the second inventive method, the same effect as in the first inventive method is obtained. In addition, an oxygen barrier film is formed to fill in a first opening formed in a second interlevel dielectric film. Thus, even if the oxygen barrier film is made of a difficult-to-etch material, the oxygen barrier film is formed easily. In addition, the oxygen barrier film is easily made thick, thus ensuring an enhanced barrier property.

In the second inventive method, the step f) preferably includes the step of removing part of the lower electrode located on the third interlevel dielectric film.

The second inventive method may include the step of forming, on parts of the third interlevel dielectric film respectively located on the bottom and wall surfaces of the second opening, an adhesion layer that is connected to the oxygen barrier film and enhances the adhesion of the lower electrode to the third interlevel dielectric film, between the steps of e) and f).

Alternatively, the second inventive method may include the step of forming, on part of the third interlevel dielectric film located on the wall of the second opening, an adhesion layer that enhances the adhesion of the lower electrode to the third interlevel dielectric film, between the steps of e) and f).

In such a case, the adhesion layer is preferably made of a metal oxide.

A third inventive method for fabricating a semiconductor device includes the steps of: a) forming a first interlevel dielectric film on a semiconductor region; b) forming, in the first interlevel dielectric film, a conductive plug connected to the semiconductor region; c) forming a conductive oxygen barrier film on the first interlevel dielectric film such that the conductive oxygen barrier film covers the conductive plug; d) forming a second interlevel dielectric film on the first interlevel dielectric film such that the oxygen barrier film is exposed from the second interlevel dielectric film; e) forming, on the exposed oxygen barrier film, a lower electrode having a relatively large thickness; f) forming a capacitive insulating film on upper and side surfaces of the lower electrode; and g) forming an upper electrode on the capacitive insulating film such that the upper electrode follows the capacitive insulating film.

In the third method, the capacitive insulating film has a face substantially perpendicular to the substrate surface over the wall surface of the lower electrode. Thus, it is possible to reduce the projected area of the capacitor onto the substrate surface, while ensuring a required capacitance. In addition, a lower electrode having a relatively large thickness is formed after the formation of an oxygen barrier film. Thus, processing can be easily performed, as compared to the case where the lower electrode and the oxygen barrier film are formed simultaneously. Further, a second interlevel dielectric is formed such that the oxygen barrier film is exposed from the second interlevel dielectric film. Thus, the second interlevel dielectric film is present around the lower electrode. Therefore, even if the lower electrode is larger than the oxygen barrier film, the lower electrode can be formed to overlap with the second interlevel dielectric film. As a result, the alignment between the oxygen barrier film and the lower electrode is performed easily.

A fourth inventive method for fabricating a semiconductor device includes the steps of: a) forming a first interlevel dielectric film on a semiconductor region; b) forming, in the first interlevel dielectric film, a conductive plug connected to the semiconductor region; c) forming a conductive oxygen barrier film on the first interlevel dielectric film such that the conductive oxygen barrier film covers the conductive plug; d) forming a second interlevel dielectric film on the first interlevel dielectric film such that the oxygen barrier film is exposed from the second interlevel dielectric film; e) forming, on the exposed oxygen barrier film, an underlying film having a relatively large thickness; f) forming a lower electrode on upper and side surfaces of the underlying film such that an end portion of the lower electrode is connected to the oxygen barrier film; g) forming a capacitive insulating film on the lower electrode such that the capacitive insulating film follows the lower electrode; and h) forming an upper electrode on the capacitive insulating film such that the upper electrode follows the capacitive insulating film.

In the fourth inventive method, the same effect as in the third inventive method is obtained. In addition, since a thick member is used as an underlying film for a lower film instead of increasing the thickness of the lower electrode itself, it is possible to select a material exhibiting processability better than the lower electrode, and thus the yield is enhanced.

The fourth inventive method preferably includes the step of forming, on the surface of the underlying film, an adhesion layer that enhances the adhesion of the lower electrode to the underlying film, between the steps of e) and f).

A fifth inventive method for fabricating a semiconductor device includes the steps of: a) forming a first interlevel dielectric film on a semiconductor region; b) forming, in the first interlevel dielectric film, a conductive plug connected to the semiconductor region; c) forming a conductive oxygen barrier film on the first interlevel dielectric film such that the conductive oxygen barrier film covers the conductive plug; d) forming a second interlevel dielectric film over the entire surface of the first interlevel dielectric film including the oxygen barrier film and then forming, in the second interlevel dielectric film, an opening in which the oxygen barrier film is exposed; e) depositing a conductive film on bottom and wall surfaces of the opening formed in the second interlevel dielectric film, thereby forming, on the oxygen barrier film, a lower electrode in the shape of a bottomed cylinder made of the conductive film and connected to the oxygen barrier film; f) removing part of the second interlevel dielectric film to expose the lower electrode and then forming a capacitive insulating film such that the capacitive insulating film follows sidewall inner and outer surfaces of the exposed lower electrode; and g) forming an upper electrode on the capacitive insulating film so that the upper electrode follows the capacitive insulating film.

In the fifth inventive method, the capacitive insulating film has a face substantially perpendicular to the substrate surface on the sidewall inner and outer surfaces of the lower electrode. Thus, it is possible to reduce the projected area of the capacitor onto the substrate surface, while increasing the capacitance significantly A sixth inventive method for fabricating a semiconductor device includes the steps of: a) forming a first interlevel dielectric film on a semiconductor region; b) forming, in the first interlevel dielectric film, a conductive plug connected to the semiconductor region; c) forming a conductive oxygen barrier film on the first interlevel dielectric film such that the conductive oxygen barrier film covers the conductive plug; d) forming a second interlevel dielectric film over the entire surface of the first interlevel dielectric film including the oxygen barrier film and then forming, in the second interlevel dielectric film, an opening in which the oxygen barrier film is exposed; e) forming a shape-sustaining film in the shape of a bottomed cylinder on bottom and wall surfaces of the opening formed in the second interlevel dielectric film; f) removing part of the second interlevel dielectric film to expose a sidewall outer surface of the shape-sustaining film, and then forming a lower electrode such that the lower electrode follows the sidewall outer surface of, and a sidewall inner surface of, the exposed shape-sustaining film and that an end portion of the lower electrode is connected to the oxygen barrier film; g) forming a capacitive insulating film on the lower electrode such that the capacitive insulating film follows the lower electrode; and h) forming an upper electrode on the capacitive insulating film such that the upper electrode follows the capacitive insulating film.

In the sixth inventive method, the same effect as in the fifth inventive method is obtained. In addition, a shape-sustaining film made of a material different from that used for the lower electrode is used as a bottomed-cylindrical member instead of using the lower electrode as the bottomed-cylindrical member. Thus, it is possible to prevent the bottomed-cylindrical member from being deformed.

In the sixth inventive method, the shape-sustaining film is preferably made of a metal oxide.

In the first through sixth inventive methods, the capacitive insulating film is preferably made of a ferroelectric or a high-dielectric-constant material.

DESCRIPTION OF THE PREFERRED EMBODIMENTS

Embodiment 1

A first embodiment of the present invention will be described with reference to the drawings.

Figure 1:
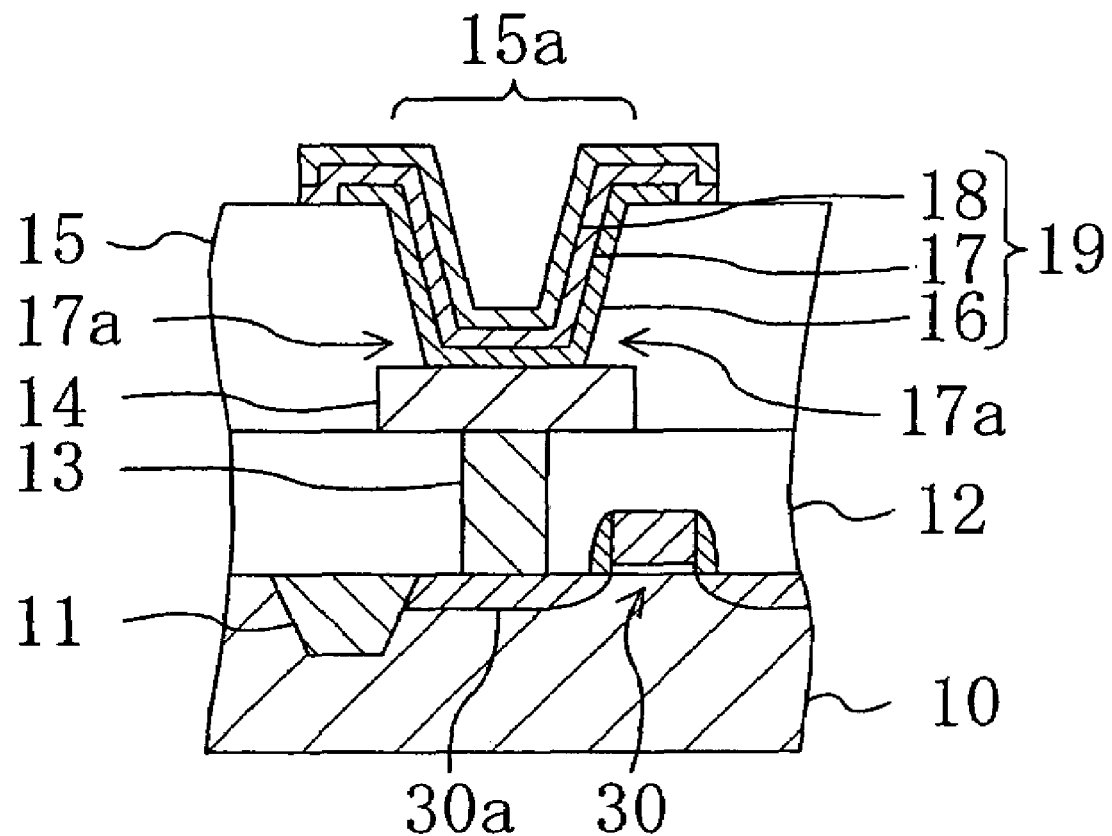
FIG. 1 is a cross-sectional view showing a structure of a semiconductor device according to a first embodiment of the present invention.

FIG. 1 shows a cross-sectional structure of a semiconductor device according to the first embodiment of the present invention.

As shown in FIG. 1, an MOS transistor 30 is formed in a transistor region defined by a shallow trench isolation (STI) film 11 in a semiconductor substrate 10 of, for example, silicon (Si). In FIG. 1, only one transistor region is shown, but the semiconductor substrate 10 includes a plurality of transistor regions. This is also applicable to the other embodiments below.

A first interlevel dielectric film 12 of silicon dioxide ($SiO_2$) with a thickness of about 500 nm is formed on the semiconductor substrate 10 including the MOS transistor 30.

A conductive plug 13 of tungsten (W) including, in a lower part thereof, a barrier layer (not shown) as a stack of titanium with a thickness of about 10 nm and titanium nitride (TiN) with a thickness of about 20 nm is formed in the interlevel dielectric film 12 to be connected to a doped source region 30a of the MOS transistor 30.

A conductive oxygen barrier film 14 is formed on the conductive plug 13 to be electrically connected to the conductive plug 13 and to cover the conductive plug 13. The oxygen barrier film 14 is made of titanium aluminum nitride (TiAlN) with a thickness of about 50 nm, iridium (Ir) with a thickness of about 50 nm and iridium dioxide ($IrO_2$) with a thickness of about 50 nm, which are stacked upwardly in this order.

A second interlevel dielectric film 15 of silicon dioxide having a thickness of about 500 nm and including an opening 15a for exposing the oxygen barrier film 14 therein is formed on the first interlevel dielectric film 12.

A lower electrode 16 of platinum (Pt) with a thickness of about 50 nm is formed on the wall surface of the opening 15a and on a part of the oxygen barrier film 14 exposed from the bottom surface of the opening 15a.

A capacitive insulating film 17 having a thickness of about 50 nm and made of a ferroelectric that is a bismuth-layered perovskite oxide containing strontium (Sr), bismuth (Bi), tantalum (Ta) and niobium (Nb) is formed on the lower electrode 16, following the lower electrode 16. An upper electrode 18 of platinum (Pt) with a thickness of about 50 nm is formed on the capacitive insulating film 17, following the capacitive insulating film 17.

In this manner, a capacitor 19 in the first embodiment is made of the lower electrode 16, the capacitive insulating film 17 and the upper electrode 18 and is provided above the conductive plug 13 formed on the doped source region 30a of the MOS transistor 30. Therefore, the unit area of the cell including the capacitor and the transistor can be reduced.

In addition, the capacitive insulating film 17 is formed to follow the bottom and wall surfaces of the opening 15a which has been formed in the second interlevel dielectric film 15 and in which the oxygen barrier film 14 is exposed. Thus, the capacitive insulating film 17 has a U-bent portion 17a that extends along the direction in which the conductive plug 13 penetrates through the first interlevel dielectric film 12. The bent portion 17a means that the capacitive insulating film 17 has a face substantially perpendicular to the substrate surface, thus further reducing the projected area of the capacitive insulating film 17 onto the substrate surface, i.e., the unit area of the cell, while ensuring a required capacitance.

Instead of silicon dioxide, the first and second interlevel dielectric films 12 and 15 may be made of any insulating material such as fluorine (F)-doped silicon oxide (FSG) having a dielectric constant smaller than that of silicon dioxide.

The conductive plug 13 is not limited to tungsten, and may be made of any conductive material such as polycrystalline silicon.

The lower and upper electrodes 16 and 18 are not limited to platinum, and may be made of any material that maintains its conductivity in an oxygen atmosphere at high temperatures.

The capacitive insulating film 17 is preferably made of a metal oxide of a ferroelectric or a metal oxide of a high-κ material.

Fabrication Method 1 for Embodiment 1

Hereinafter, a first method for fabricating the semiconductor device thus configured will be described with reference to the drawings.

Figure 2A:
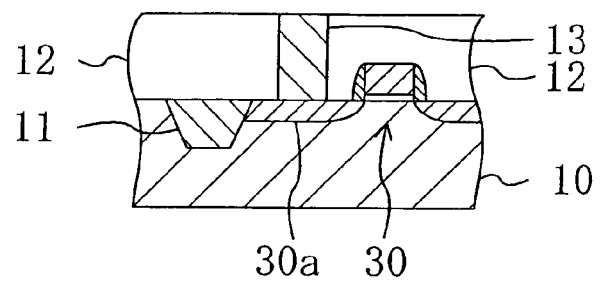
FIGS. 2A through 2D are cross-sectional views showing respective process steps in a first method for fabricating the semiconductor device of the first embodiment

FIGS. 2A though 2D show cross-sectional structures in respective process steps of the first method for fabricating the semiconductor device of the first embodiment.

First, as shown in FIG. 2A, an STI film 11 is selectively formed in an upper part of the principal surface of a semiconductor substrate 10 to divide the principal surface into a plurality of transistor regions. Thereafter, an MOS transistor 30 is formed in each of the transistor regions. Then, a first interlevel dielectric film 12 of silicon dioxide is deposited by a chemical vapor deposition (CVD) process to a thickness of about 1000 nm over the entire surface of the semiconductor substrate 10 including the MOS transistor 30. Subsequently, the surface of the first interlevel dielectric film 12 is planarized by a chemical mechanical polishing (CMP) process so that the thickness thereof is about 500 nm. Then, through a lithography process and a dry etching process, a contact hole is selectively formed in part of the first interlevel dielectric film 12 located over a source region 30a of the MOS transistor 30. Subsequently, titanium and titanium nitride are deposited by a sputtering or CVD process to thicknesses of about 10 nm and about 20 nm, respectively, over the first interlevel dielectric film 12 including the contact hole, thereby forming a barrier layer (not shown). Then, a metal film of tungsten is deposited by a CVD process to a thickness of about 500 nm on the barrier layer to fill in the contact hole. Thereafter, respective parts of the barrier layer and the metal film located over the first interlevel dielectric film 12 are removed by a CMP process, thereby forming a conductive plug 13 out of the barrier layer and the metal film in the contact hole.

Figure 2B:
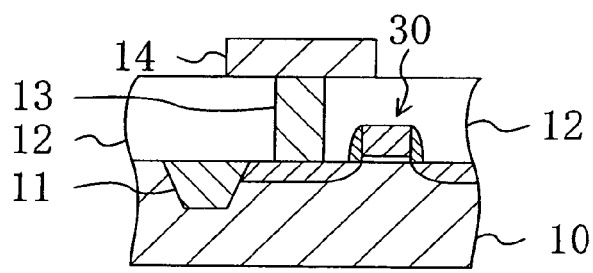

Next, as shown in FIG. 2B, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film.

Figure 2C:
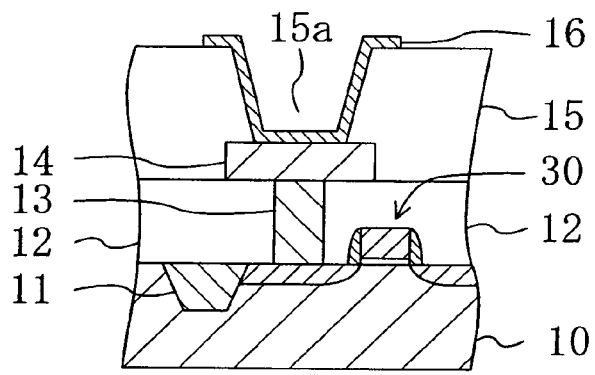

The, as shown in FIG. 2C, a second interlevel dielectric film 15 of silicon dioxide is deposited by a CVD process to a thickness of about 1000 nm over the entire surface of the first interlevel dielectric film 12 including the oxygen barrier film 14. Thereafter, the surface of the second interlevel dielectric film 15 is planarized by a CMP process so that the thickness thereof is about 500 nm. Subsequently, an opening 15a for exposing the oxygen barrier film 14 therein is formed in the second interlevel dielectric film 15 by a lithography process and a dry etching process. Then, a lower-electrode formation film of platinum is deposited by a sputtering or CVD process to a thickness of about 50 nm over the second interlevel dielectric film 15 including the opening 15a. Thereafter, the lower-electrode formation film is patterned by a lithography process and a dry etching process such that the lower-electrode formation film remains at least on the bottom and wall surfaces of the opening 15a, thereby forming a lower electrode 16 out of the lower-electrode formation film.

Figure 2D:
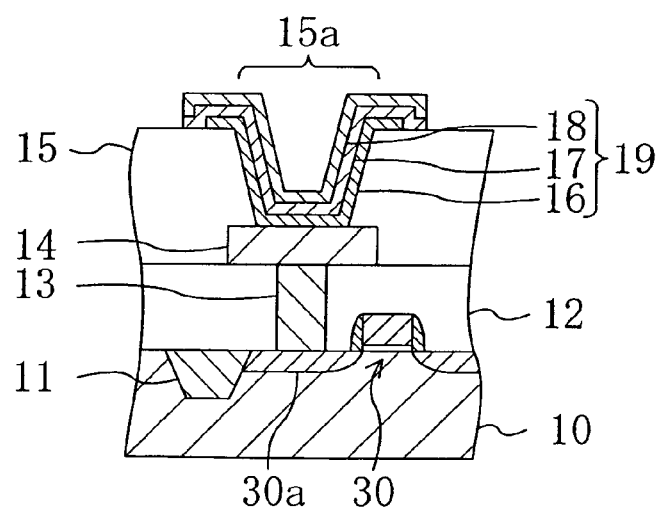

Then, as shown in FIG. 2D, a capacitive-insulating-film formation film of a ferroelectric containing strontium, bismuth, tantalum and niobium is deposited by a CVD process to a thickness of about 50 nm over the second interlevel dielectric film 15 as well as the lower electrode 16. Subsequently, an upper-electrode formation film of platinum is deposited by a sputtering or CVD process to a thickness of about 50 nm over the capacitive-insulating-film formation film. Thereafter, the capacitive-insulating-film formation film and the upper-electrode formation film are patterned by a lithography process and a dry-etching process in a region including the lower electrode 16, thereby forming a capacitive insulating film 17 and an upper electrode 18 out of the capacitive-insulating-film formation film and the upper-electrode formation film, respectively. Subsequently, annealing is performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the first fabrication method for the first embodiment, the oxygen barrier film 14 is interposed between the lower electrode 16 and the conductive plug 13. Thus, the conductive plug 13 is not oxidized by oxygen atoms constituting the capacitive insulating film 17 during the annealing for crystallizing the capacitive insulating film 17.

In addition, the oxygen barrier film 14 and the lower electrode 16 are formed in different process steps. Therefore, if the oxygen barrier film 14 is made relatively thick, the barrier property of the oxygen barrier film 14 can be improved. On the other hand, the lower electrode 16 is made relatively thin, the capacitive insulating film 17 has a face substantially perpendicular to the substrate surface, thus ensuring a larger surface area of the capacitive insulating film 17.

Accordingly, it is possible to avoid the problem that a refractory metal such as platinum is generally resistant to etching when the lower electrode 16 is relatively thick, for example. It is also possible to prevent the problem that the opening 15a, formed in the second interlevel dielectric film 15 to apply a three-dimensional structure to the bent portion 17a of the capacitive insulating film 17, becomes small in diameter to reduce the effective area of the capacitive insulating film 17.

Fabrication Method 2 for Embodiment 1

Hereinafter, a second method for fabricating the semiconductor device of the first embodiment will be described with reference to the drawings.

Figure 3A:
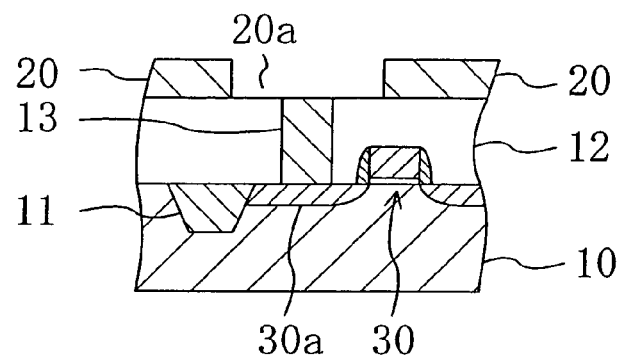
FIGS. 3A through 3D are cross-sectional views showing respective process steps in a second method for fabricating the semiconductor device of the first embodiment

FIGS. 3A though 3D show cross-sectional structures in respective process steps of the second method for fabricating the semiconductor device of the first embodiment. In FIGS. 3A though 3D, each component also shown in FIGS. 2A though 2D is identified by the same reference numeral.

First, as shown in FIG. 3A, as in the first fabrication method, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier film and tungsten is formed in the contact hole. Thereafter, a second interlevel dielectric film 20 of silicon dioxide is deposited by a CVD process to a thickness of about 150 nm. Then, through a lithography process and a dry etching process, a first opening 20a is formed in the second interlevel dielectric film 20 so that the conductive plug 13 is exposed therein.

Figure 3B:
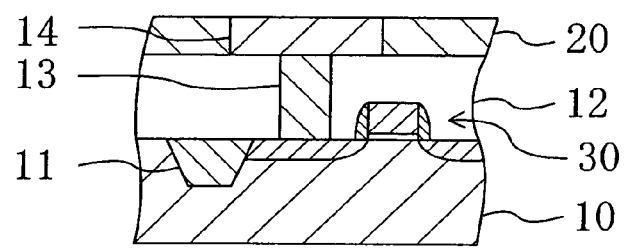

Next, as shown in FIG. 3B, titanium aluminum nitride, iridium and iridium dioxide are deposited in this order by a sputtering process each to a thickness of about 50 nm over the entire surface of the first interlevel dielectric film 12 including the first opening 20a, thereby forming an oxygen-barrier formation film. Subsequently, part of the oxygen-barrier formation film located over the second interlevel dielectric film 20 is removed by a CMP process, thereby forming an oxygen barrier film 14 in the first opening 20a of the second interlevel dielectric film 20.

Figure 3C:
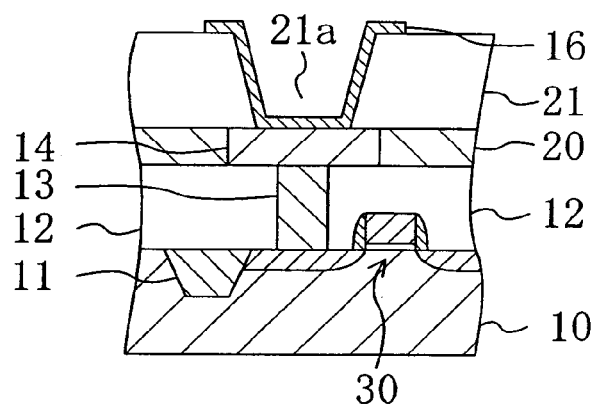

The, as shown in FIG. 3C, a third interlevel dielectric film 21 of silicon dioxide is deposited by a CVD process to a thickness of about 500 nm over the entire surface of the second interlevel dielectric film 20 including the oxygen barrier film 14. Subsequently, a second opening 21a for exposing the oxygen barrier film 14 therein is formed by a lithography process and a dry etching process in the third interlevel dielectric film 21. Then, a lower-electrode formation film of platinum is deposited by a sputtering or CVD process to a thickness of about 50 nm over the third interlevel dielectric film 21 including the second opening 21a. Thereafter, the lower-electrode formation film is patterned by a lithography process and a dry etching process such that the lower-electrode formation film remains at least on the bottom and wall surfaces of the second opening 21a, thereby forming a lower electrode 16 out of the lower-electrode formation film.

Figure 3D:
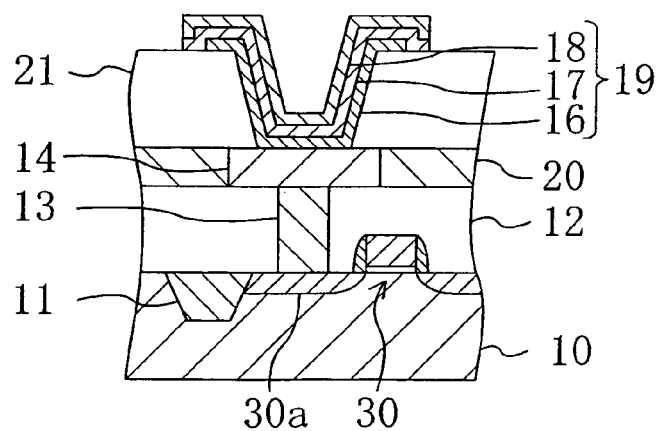

Then, as shown in FIG. 3D, a capacitive insulating film 17 of a ferroelectric containing strontium, bismuth, tantalum and niobium with a thickness of about 50 nm is formed by a CVD process over the third interlevel dielectric film 21 as well as the lower electrode 16. Subsequently, an upper electrode 18 of platinum with a thickness of about 50 nm is formed on the capacitive insulating film 17 by a sputtering or CVD process. In this case, the capacitive insulating film 17 and the upper electrode 18 are patterned using the same mask. In this manner, a capacitor 19 made of the lower electrode 16, the capacitive insulating film 17 and the upper electrode 18 is formed. In this method, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the second fabrication method for the first embodiment, the oxygen barrier film 14 is formed to fill in the first opening 20a of the second interlevel dielectric film 20 that determines the thickness of the oxygen barrier film 14. Thus, even if the oxygen barrier film 14 is made of a difficult-to-etch material, fine patterning of the oxygen barrier film 14 is easily attained. In addition, the thickness of the oxygen barrier film 14 is easily increased in order to obtain a higher barrier property.

Variation of Fabrication Method 1

Hereinafter, a variation of the first method for fabricating the semiconductor device of the first embodiment will be described with reference to the drawings.

Figure 4A:
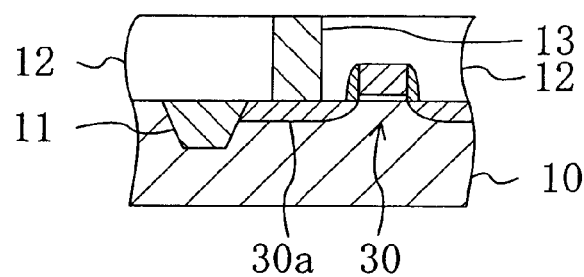
FIGS. 4A through 4D are cross-sectional views showing respective process steps in a variation of the first method for fabricating the semiconductor device of the first embodiment

FIGS. 4A though 4D show cross-sectional structures in respective process steps of the variation of the first method for fabricating the semiconductor device of the first embodiment. In FIGS. 4A though 4D, each component also shown in FIGS. 2A though 2D is identified by the same reference numeral.

First, as shown in FIG. 4A, as in the first fabrication method, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole.

Figure 4B:
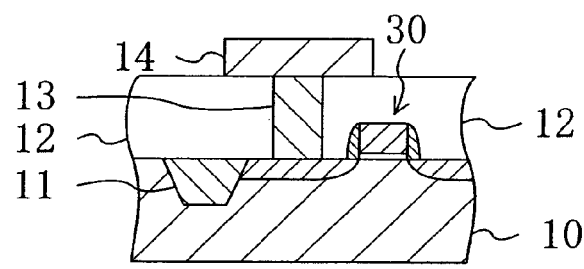

Next, as shown in FIG. 4B, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming the oxygen barrier film 14 out of an oxygen-barrier formation film.

Figure 4C:
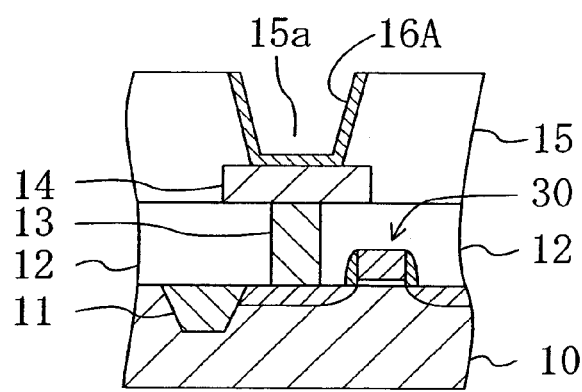

The, as shown in FIG. 4C, a second interlevel dielectric film 15 of silicon dioxide is deposited by a CVD process to a thickness of about 1000 nm over the entire surface of the first interlevel dielectric film 12 as well as the oxygen barrier film 14. Subsequently, the surface of the second interlevel dielectric film 15 is planarized by a CMN process such that the thickness thereof is about 500 nm. Thereafter, an opening 15a for exposing the oxygen barrier film 14 therein is formed in the second interlevel dielectric film 15 by a lithography process and a dry etching process. Then, a lower-electrode formation film of platinum is deposited by a sputtering or CVD process to a thickness of about 50 nm on the bottom and wall surfaces of the opening 15a so as to be connected to the oxygen barrier film 14. Thereafter, part of the lower-electrode formation film located over the second interlevel dielectric film 15 is removed by a CMP process or a resist etch back process so that the lower-electrode formation film remains on the bottom and wall surfaces of the opening 15a, thereby forming a lower electrode 16A out of the lower-electrode formation film.

Figure 4D:
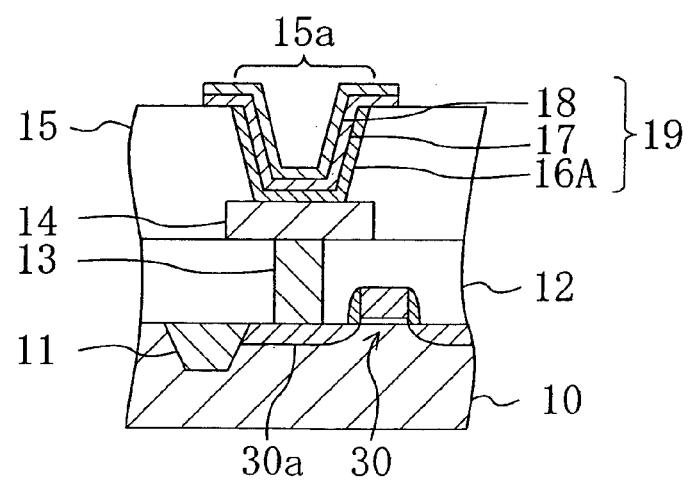

Then, as shown in FIG. 4D, a capacitive insulating film 17 having a thickness of about 50 nm and made of a ferroelectric containing strontium, bismuth, tantalum and niobium is deposited by a CVD process on the second interlevel dielectric film 15 including the lower electrode 16A. Subsequently, an upper electrode 18 of platinum with a thickness of about 50 nm is formed by a sputtering or CVD process on the capacitive insulating film 17. In this manner, a capacitor 19 made of the lower electrode 16A, the capacitive insulating film 17 and the upper electrode 18 is formed. In this variation, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the variation of the first fabrication method, in the process step of forming the lower electrode 16A shown in FIG. 4C, the lower electrode 16A is formed through the CMP process or the resist etch back process so that no alignment margin is required between the opening 15a of the second interlevel dielectric film 15 and the lower electrode 16A. Accordingly, the area of each cell can be further reduced.

In this variation, the second fabrication method, i.e., the method of forming the oxygen barrier film 14 such that an opening in an interlevel dielectric film is filled therewith, may also be used for the formation of the oxygen barrier film 14.

Embodiment 2

Hereinafter, a second embodiment of the present invention will be described with reference to the drawings.

Figure 5:
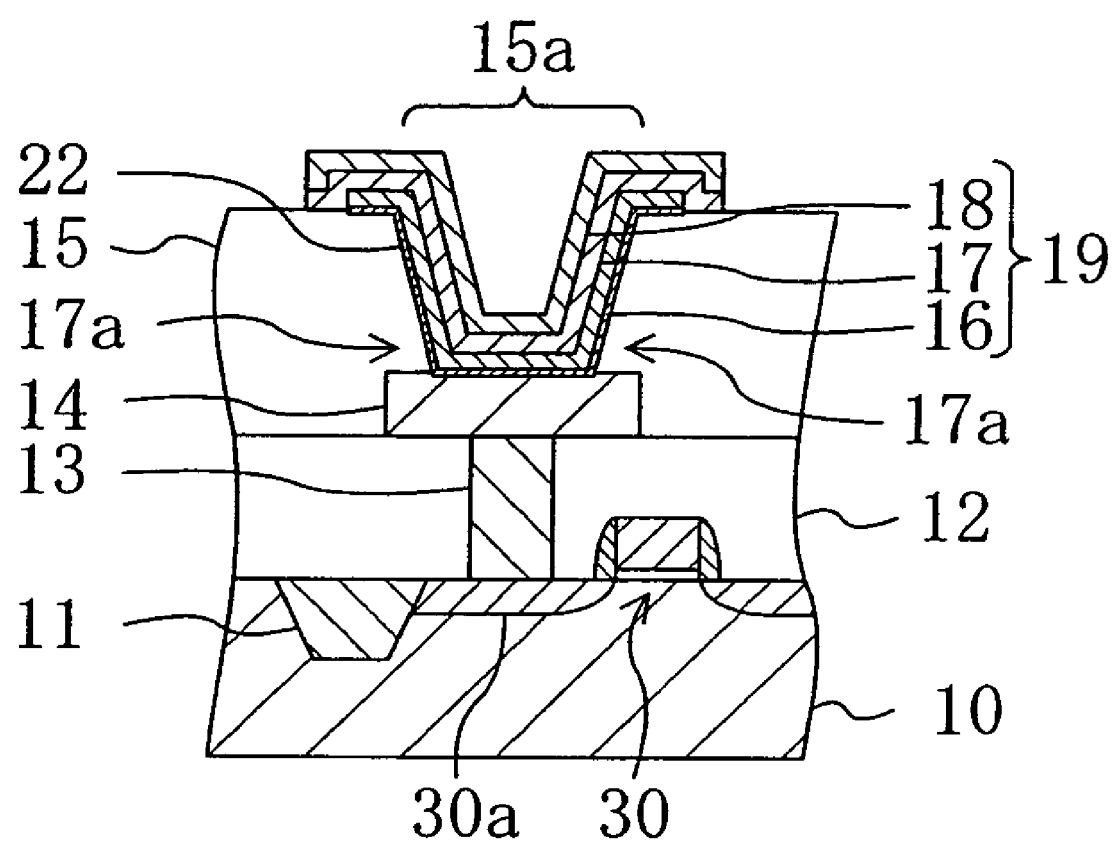
FIG. 5 is a cross-sectional view showing a structure of a semiconductor device according to a second embodiment of the present invention.

FIG. 5 shows a cross-sectional structure of a semiconductor device according to the second embodiment of the present invention. In FIG. 5, each component also shown in FIG. 1 is identified by the same reference numeral and the description thereof will be omitted herein.

As shown in FIG. 5, in the semiconductor device of the second embodiment, a conductive adhesion layer 22 of iridium oxide with a thickness of about 5 nm is provided on the bottom and wall surfaces of an opening 15a formed in a second interlevel dielectric film 15.

The adhesion layer 22 improves the adhesion between the second interlevel dielectric film 15 of silicon dioxide and a lower electrode 16 of platinum: Thus, the lower electrode 16 does not easily peel off from the second interlevel dielectric film 15.

Hereinafter, a method for fabricating the semiconductor device thus configured will be described with reference to the drawings.

Figure 6A:
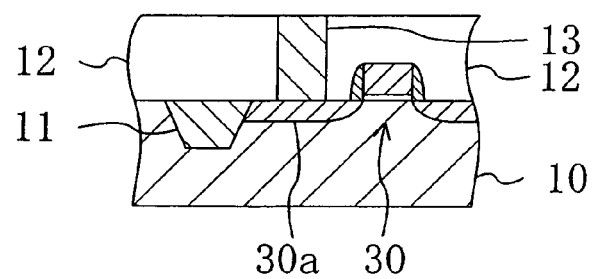
FIGS. 6A through 6D are cross-sectional views showing respective process steps in a method for fabricating the semiconductor device of the second embodiment

FIGS. 6A though 6D show cross-sectional structures in respective process steps of the method for fabricating the semiconductor device of the second embodiment. In FIGS. 6A though 6D, each component also shown in FIGS. 2A though 2D is identified by the same reference numeral.

First, as shown in FIG. 6A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole.

Figure 6B:
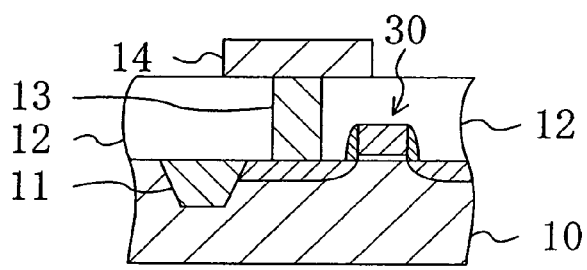

Next, as shown in FIG. 6B, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film.

Figure 6C:
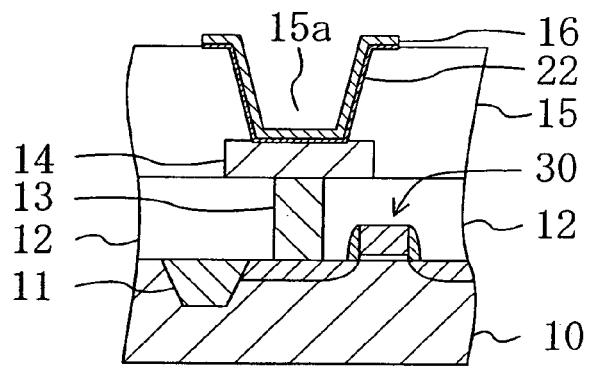

The, as shown in FIG. 6C, a second interlevel dielectric film 15 of silicon dioxide is deposited by a CVD process to a thickness of about 1000 nm over the entire surface of the first interlevel dielectric film 12 as well as the oxygen barrier film 14. Thereafter, the surface of the second interlevel dielectric film 15 is planarized by a CMP process so that the thickness thereof is about 500 nm. Subsequently, an opening 15a for exposing the oxygen barrier film 14 therein is formed in the second interlevel dielectric film 15 by a lithography process and a dry etching process. Then, an adhesion layer 22 of iridium oxide and a lower-electrode formation film of platinum are sequentially deposited by a sputtering or CVD process to thicknesses of about 5 nm and about 50 nm, respectively, over the second interlevel dielectric film 15 including the opening 15a. Thereafter, the adhesion layer 22 and the lower-electrode formation film are patterned by a lithography process and a dry etching process such that the adhesion layer 22 and the lower-electrode formation film remain at least on the bottom and wall surfaces of the opening 15a, thereby forming a lower electrode 16 with the adhesion layer 22 interposed between the second interlevel dielectric film 15 and the lower electrode 16.

Figure 6D:
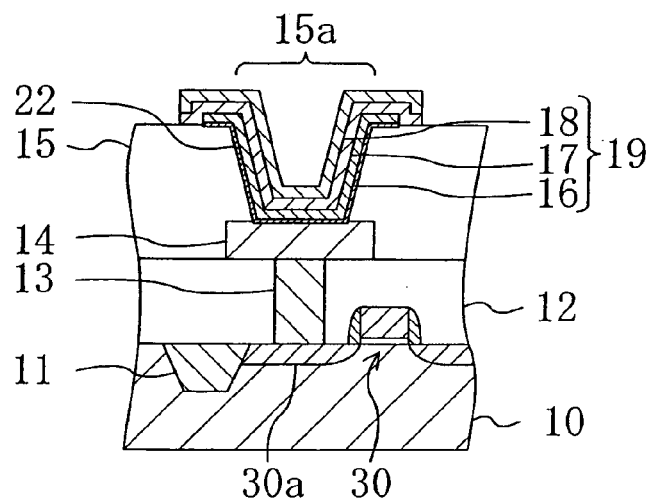

Then, as shown in FIG. 6D, a capacitive insulating film 17 having a thickness of about 50 nm and made of a ferroelectric containing strontium, bismuth, tantalum and niobium is formed by a CVD process over the second interlevel dielectric film 15 as well as the lower electrode 16. Subsequently, an upper electrode 18 of platinum with a thickness of about 50 nm is formed through a sputtering or CVD process on the capacitive insulating film 17. In this case, the capacitive insulating film 17 and the upper electrode 18 are patterned using the same mask. In this manner, a capacitor 19 made of the lower electrode 16, the capacitive insulating film 17 and the upper electrode 18 is formed. In this embodiment, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the second embodiment, the adhesion layer 22 of iridium oxide with a thickness of about 5 nm is provided on the bottom and wall surfaces of the opening 15a of the second interlevel dielectric film 15. Thus, it is possible to prevent the lower electrode 16 from peeling off from the second interlevel dielectric film 15 during the annealing for crystallizing the ferroelectric constituting the capacitive insulating film 17.

In the second embodiment, the second fabrication method for the first embodiment, i.e., the method of forming the oxygen barrier film 14 such that an opening formed in an interlevel dielectric film is filled therewith, may also be used for the formation of the oxygen barrier film 14.

In the process step shown in FIG. 6C, the formation of the adhesion layer 22 and the lower electrode 16 may be performed through a CMP process, for example, as shown in FIG. 4C, instead of a patterning process using lithography and etching.

Variation of Embodiment 2

Hereinafter, a variation of the second embodiment of the present invention will be described with reference to the drawings.

Figure 7:
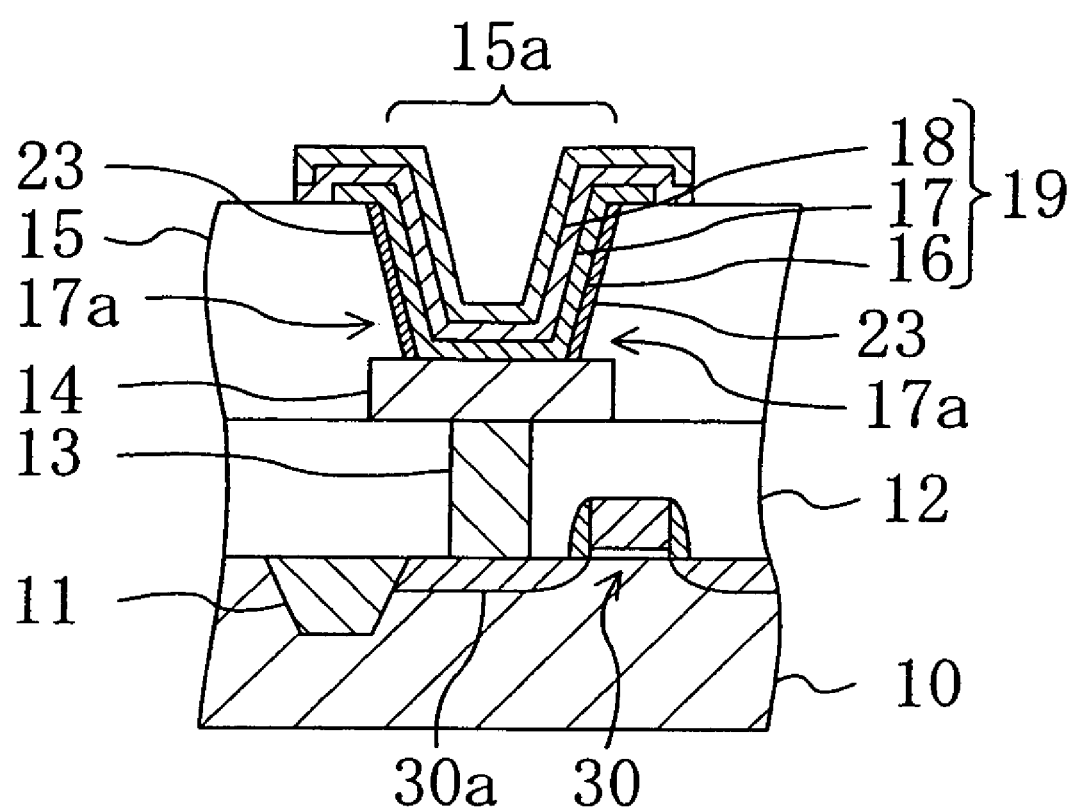
FIG. 7 is a cross-sectional view showing a structure of a semiconductor device according to a variation of the second embodiment.

FIG. 7 shows a cross-sectional structure of a semiconductor device according to the variation of the second embodiment of the present invention. In FIG. 7, each component also shown in FIG. 5 is identified by the same reference numeral and the description thereof will be omitted herein.

The semiconductor device of this variation is characterized in that an insulating adhesion layer 23 of titanium dioxide ($TiO_2$) with a thickness of about 10 nm is provided on the wall surface of an opening 15a formed in a second interlevel dielectric film 15.

The adhesion layer 23 improves the adhesion between the second interlevel dielectric film 15 of silicon dioxide and a lower electrode 16 of platinum. Thus, the lower electrode 16 does not easily peel off from the second interlevel dielectric film 15. In addition, since the adhesion layer 23 is selectively formed only on the wall surface of the opening 15a, an oxygen barrier film 14 is in direct contact with the lower electrode 16. Accordingly, unlike the second embodiment, a material that is not conductive may be used for the adhesion layer 23 in this variation. As a result, the range of choice of a material for the adhesion layer 23 is extended to materials such as materials having high adhesion properties and inexpensive materials.

The adhesion layer 23 may be made of any material exhibiting excellent adhesion between the second interlevel dielectric film 15 and the lower electrode 16.

Hereinafter, a method for fabricating the semiconductor device thus configured will be described with reference to the drawings.

Figure 8A:
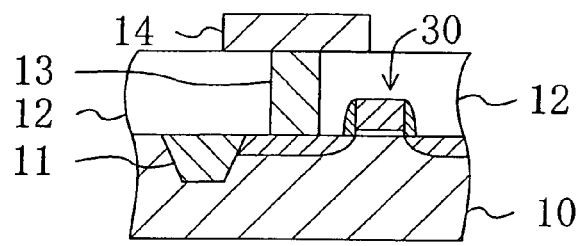
FIGS. 8A through 8D are cross-sectional views showing respective process steps in a method for fabricating the semiconductor device of the variation of the second embodiment

FIGS. 8A though 8D show cross-sectional structures in respective process steps of the method for fabricating the semiconductor device of the variation of the second embodiment. In FIGS. 8A though 8D, each component also shown in FIGS. 6A though 6D is identified by the same reference numeral.

First, as shown in FIG. 8A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole. Thereafter, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film.

Figure 8B:
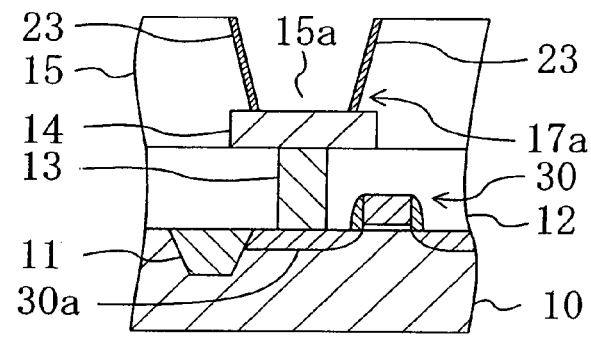

Next, as shown in FIG. 8B, a second interlevel dielectric film 15 of silicon dioxide is deposited by a CVD process to a thickness of about 1000 nm over the entire surface of the first interlevel dielectric film 12 as well as the oxygen barrier film 14. Thereafter, the surface of the second interlevel dielectric film 15 is planarized by a CMP process so that the thickness thereof is about 500 nm. Subsequently, an opening 15a for exposing the oxygen barrier film 14 therein is formed in the second interlevel dielectric film 15 by a lithography process and a dry etching process. Then, a metal layer of titanium (Ti) is deposited by a sputtering or CVD process to a thickness of about 5 nm on the bottom and wall surfaces of the opening 15a. The metal layer is subjected to oxidation at a temperature of about 650° C. in an oxygen atmosphere for about 60 minutes so that the metal layer is oxidized, thereby forming an adhesion-layer formation layer of titanium dioxide. Subsequently, the adhesion-layer formation layer is etched back by anisotropic etching using a chlorine ($Cl_2$) gas, thereby forming an adhesion layer 23 out of the adhesion-layer formation layer on the wall surface of the opening 15a of the second interlevel dielectric film 15.

Figure 8C:
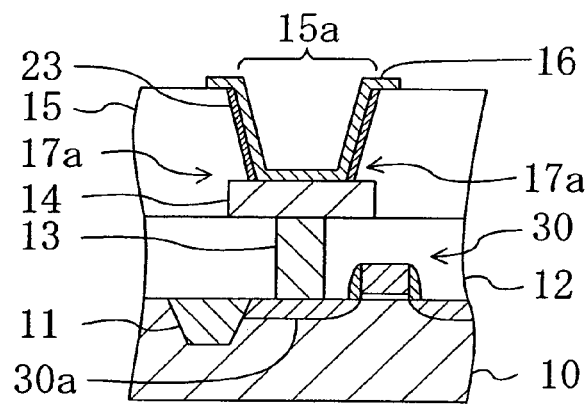

Then, as shown in FIG. 8C, a lower-electrode formation film of platinum is deposited by a sputtering or CVD process to a thickness of about 50 nm over the second interlevel dielectric film 15 including the opening 15a. Thereafter, the lower-electrode formation film is patterned by a lithography process and a dry etching process such that the lower-electrode formation film remains at least on the bottom and wall surfaces of the opening 15a, thereby forming a lower electrode 16 with the adhesion layer 23 interposed between the second interlevel dielectric film 15 and the lower electrode 16.

Figure 8D:
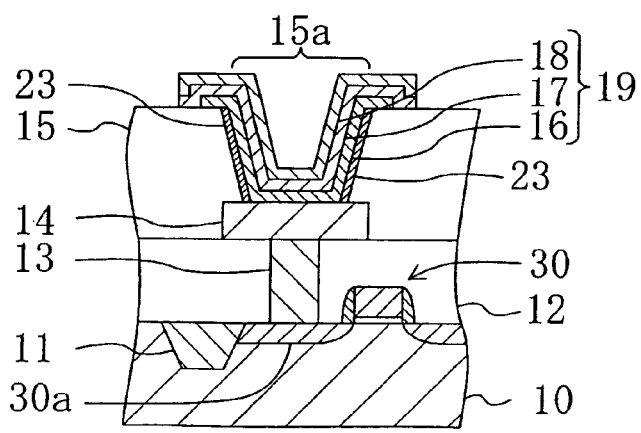

Then, as shown in FIG. 8D, a capacitive insulating film 17 having a thickness of about 50 nm and made of a ferroelectric containing strontium, bismuth, tantalum and niobium is formed by a CVD process on the second interlevel dielectric film 15 as well as the lower electrode 16. Subsequently, an upper electrode 18 of platinum with a thickness of about 50 nm is formed through a sputtering or CVD process on the capacitive insulating film 17. In this manner, a capacitor 19 made of the lower electrode 16, the capacitive insulating film 17 and the upper electrode 18 is formed. In this variation, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in this variation, the adhesion layer 23 of titanium dioxide with a thickness of about 5 nm is provided on the wall surface of the opening 15a of the second interlevel dielectric film 15. Thus, it is possible to prevent the lower electrode 16 from peeling off from the second interlevel dielectric film 15 during the annealing for crystallizing the ferroelectric constituting the capacitive insulating film 17.

Since the adhesion layer 23 is made of a metal oxide, the adhesion between the lower electrode 16 and the second interlevel dielectric film 15 improves due to the reaction between the adhesion layer 23 and the lower electrode 16. In addition, diffusion of metal from the adhesion layer 23 to the capacitive insulating film 17 is prevented during annealing performed on the capacitive insulating film 17.

Further, as shown in FIG. 8B, the adhesion layer 23 is formed only on the wall surface of the opening 15a and the lower electrode 16 is directly connected to the conductive oxygen barrier film 14. Thus, an insulating material may be used for the adhesion layer 23.

In this variation, the second fabrication method for the first embodiment, i.e., the method of forming the oxygen barrier film 14 such that an opening formed in an interlevel dielectric film is filled therewith, may also be used for the formation of the oxygen barrier film 14.

In the process step shown in FIG. 8C, the formation of the lower electrode 16 may be performed through a CMP process, as shown in FIG. 4C, instead of a patterning process using lithography and etching.

Embodiment 3

Hereinafter, a third embodiment of the present invention will be described with reference to the drawings.

Figure 9:
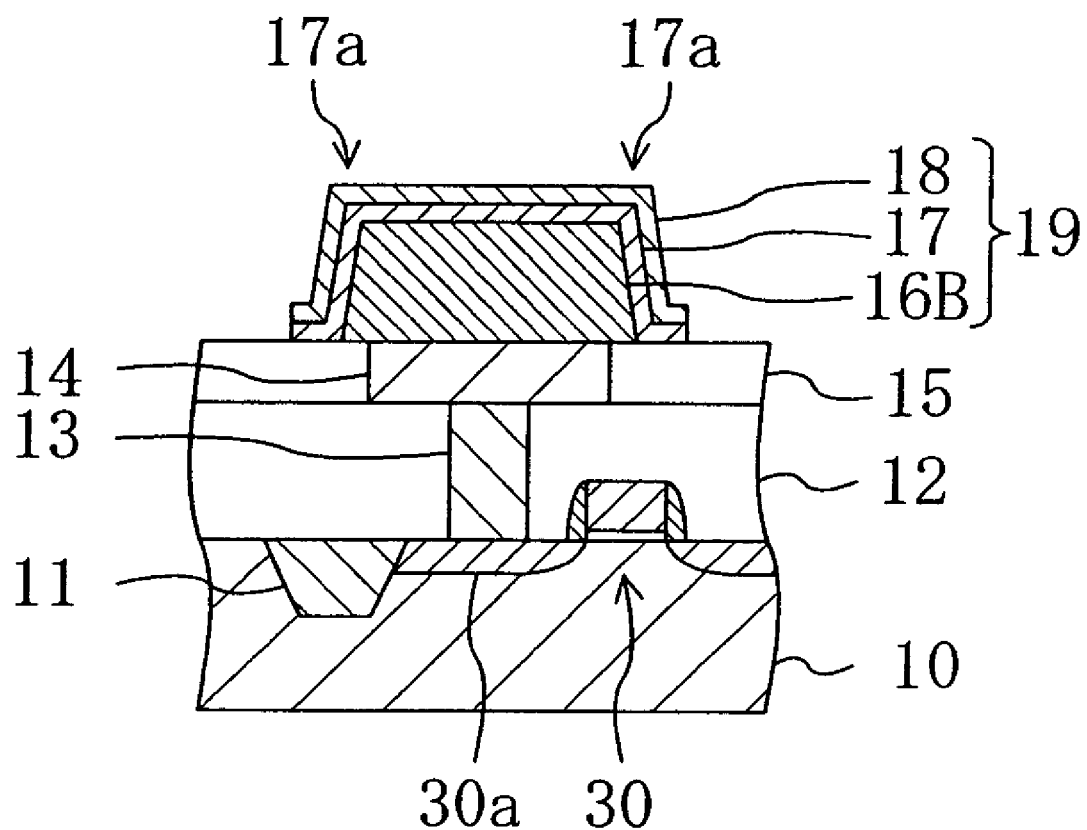
FIG. 9 is a cross-sectional view showing a structure of a semiconductor device according to a third embodiment of the present invention.

FIG. 9 shows a cross-sectional structure of a semiconductor device according to the third embodiment of the present invention. In FIG. 9, each component also shown in FIG. 1 is identified by the same reference numeral and the description thereof will be omitted herein.

As shown in FIG. 9, the semiconductor device of the third embodiment has a stacked cell structure in which a conductive plug 13, an oxygen barrier film 14 and a capacitor 19 are stacked perpendicularly to the substrate surface, as in the first and second embodiments.

The third embodiment is characterized in that a lower electrode 16B constituting the capacitor 19 is made of platinum and has a relatively large thickness of about 300 nm.

A capacitive insulating film 17 of a ferroelectric having a thickness of about 50 nm and formed on the surface of the lower electrode 16B, has an inverted U-bent portion 17a over the corners between the upper and side surfaces of the lower electrode 16B. The bent portion 17a means that the capacitive insulating film 17 has a face substantially perpendicular to the substrate surface, thus reducing the projected area of the capacitive insulating film 17 onto the substrate surface, while ensuring a required capacitance.

Hereinafter, a method for fabricating the semiconductor device thus configured will be described with reference to the drawings.

Figure 10A:
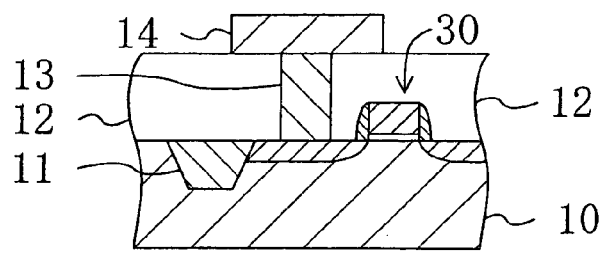
FIGS. 10A through 10D are cross-sectional views showing respective process steps in a method for fabricating the semiconductor device of the third embodiment

FIGS. 10A though 10D show cross-sectional structures in respective process steps of the method for fabricating the semiconductor device of the third embodiment. In FIGS. 10A though 10D, each component also shown in FIGS. 2A though 2D is identified by the same reference numeral.

First, as shown in FIG. 10A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole. Thereafter, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film.

Figure 10B:
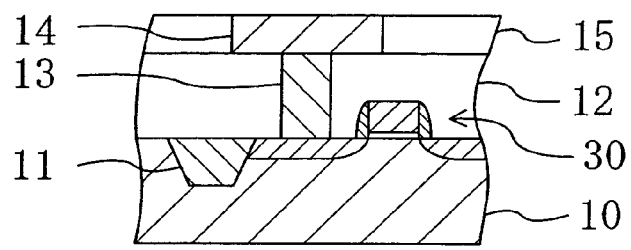

Next, as shown in FIG. 10B, a second interlevel dielectric film 15 of silicon dioxide is deposited by a CVD process to a thickness of about 300 nm over the entire surface of the first interlevel dielectric film 12 including the oxygen barrier film 14. Thereafter, the surface of the second interlevel dielectric film 15 is polished by a CMP process until the oxygen barrier film 14 is exposed, thereby planarizing the surfaces of the second interlevel dielectric film 15 and the oxygen barrier film 14.

Figure 10C:
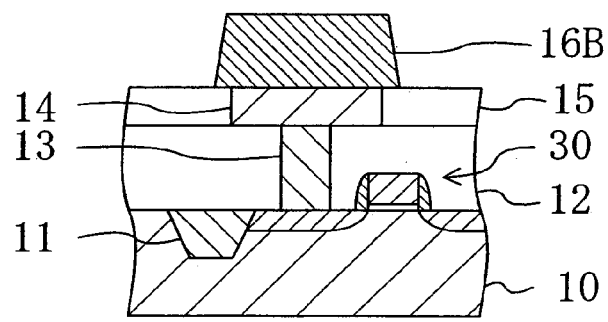

Then, as shown in FIG. 10C, a lower-electrode formation film of platinum is deposited by a sputtering process to a thickness of about 300 nm over the second interlevel dielectric film 15 including the oxygen barrier film 14. Thereafter, the lower-electrode formation film is patterned by a lithography process and a dry etching process such that the lower-electrode formation film remains over the oxygen barrier film 14, thereby forming a thick lower electrode 16B out of the lower-electrode formation film.

Figure 10D:
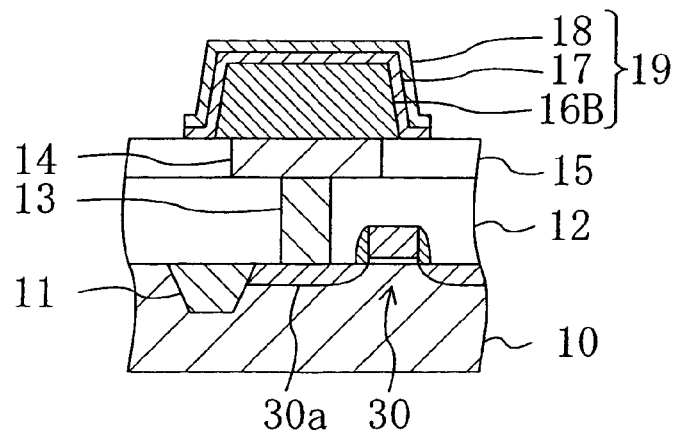

Then, as shown in FIG. 10D, a capacitive insulating film 17 having a thickness of about 50 nm and made of a ferroelectric containing strontium, bismuth, tantalum and niobium is formed by a CVD process to cover the lower electrode 16B. Subsequently, an upper electrode 18 of platinum with a thickness of about 50 nm is formed through a sputtering or CVD process to cover the capacitive insulating film 17. In this case, the capacitive insulating film 17 and the upper electrode 18 are patterned using the same mask. In this manner, a capacitor 19 made of the lower electrode 16B, the capacitive insulating film 17 and the upper electrode 18 is formed. In this embodiment, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the fabrication method in the third embodiment, the relatively thick lower electrode 16B is formed after the formation of the oxygen barrier film 14. Thus, processing can be easily performed, as compared to the case where the lower electrode 16B and the oxygen barrier film 14 are formed simultaneously.

Since the oxygen barrier film 14 in the third embodiment is surrounded with the second interlevel dielectric film 15, the base area of the lower electrode 16B can be made larger than that of the oxygen barrier film 14. Accordingly, no alignment error occurs during the alignment between the lower electrode 16B and the oxygen barrier film 14.

In the third embodiment, the second fabrication method for the first embodiment, i.e., the method of forming an opening in the second interlevel dielectric film 15 and filling in the opening with the oxygen barrier film 14, may also be used for the formation of the oxygen barrier film 14.

Embodiment 4

Hereinafter, a fourth embodiment of the present invention will be described with reference to the drawings.

Figure 11:
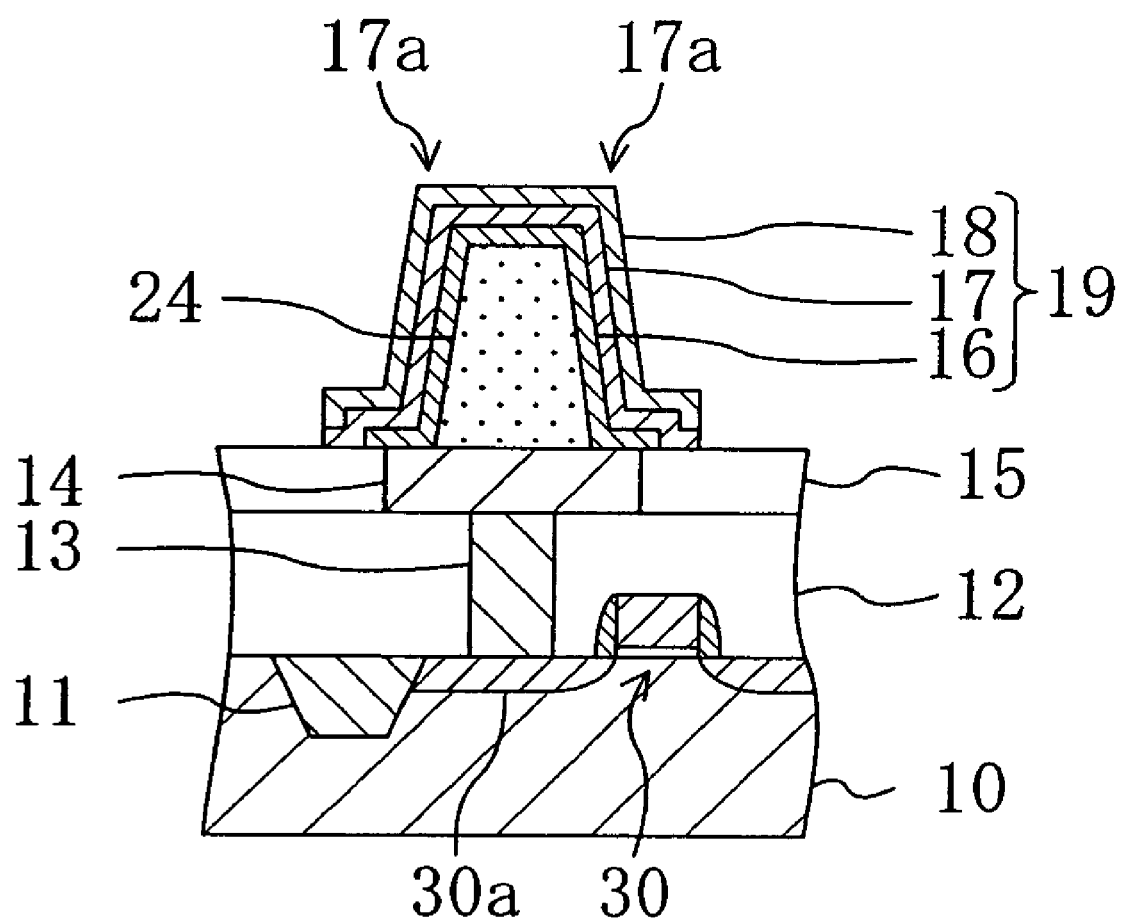
FIG. 11 is a cross-sectional view showing a structure of a semiconductor device according to a fourth embodiment of the present invention.

FIG. 11 shows a cross-sectional structure of a semiconductor device according to the fourth embodiment of the present invention. In FIG. 11, each component also shown in FIG. 1 is identified by the same reference numeral and the description thereof will be omitted herein.

As shown in FIG. 11, the semiconductor device of the fourth embodiment has a stacked cell structure in which a conductive plug 13, an oxygen barrier film 14 and a capacitor 19 are stacked perpendicularly to the substrate surface, as in the first through third embodiments.

In the fourth embodiment, instead of increasing the thickness of a lower electrode 16 of the capacitor 19, the capacitor 19 is formed over a relatively thick underlying film 24 made of an insulating material and having, for example, a columnar shape.

In this structure, a capacitive insulating film 17 of a ferroelectric having a thickness of about 50 nm and formed on the surface of the lower electrode 16 has an inverted U-bent portion 17a over the corners between the upper and side surfaces of the underlying film 24. The bent portion 17a means that the capacitive insulating film 17 has a face substantially perpendicular to the substrate surface, thus reducing the projected area of the capacitive insulating film 17 onto the substrate surface, while ensuring a required capacitance.

In addition, the underlying film 24 allows the lower electrode 16 to have a relatively small thickness. Thus, the lower electrode 16 itself is easily processed, and thus a dimension perpendicular to the substrate surface, i.e., the height, can be easily increased as intended.

Hereinafter, a method for fabricating the semiconductor device thus configured will be described with reference to the drawings.

Figure 12A:
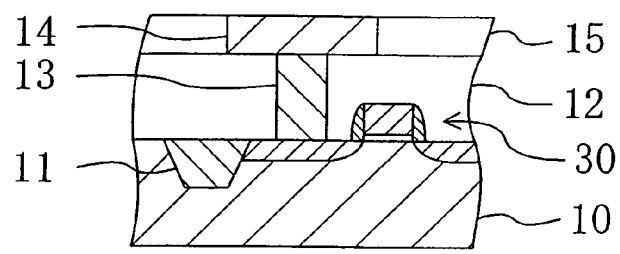
FIGS. 12A through 12D are cross-sectional views showing respective process steps in a method for fabricating the semiconductor device of the fourth embodiment

FIGS. 12A though 12D show cross-sectional structures in respective process steps of the method for fabricating the semiconductor device of the fourth embodiment. In FIGS. 12A though 12D, each component also shown in FIGS. 2A though 2D is identified by the same reference numeral.

First, as shown in FIG. 12A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole. Thereafter, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film. Thereafter, a second interlevel dielectric film 15 of silicon dioxide is deposited by a CVD process to a thickness of about 300 nm over the entire surface of the first interlevel dielectric film 12 as well as the oxygen barrier film 14. Then, the surface of the second interlevel dielectric film 15 is polished by a CMP process until the oxygen barrier film 14 is exposed, thereby planarizing the surfaces of the second interlevel dielectric film 15 and the oxygen barrier film 14.

Figure 12B:
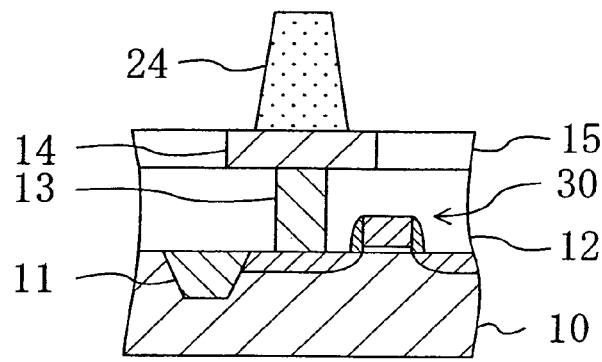

Next, as shown in FIG. 12B, an underlying-film formation film of silicon oxide is deposited by a CVD process to a thickness of about 500 nm over the entire surface of the second interlevel dielectric film 15 including the oxygen barrier film 14. Then, part of the underlying-film formation film located over the oxygen barrier film 14 is patterned by a lithography process and a dry etching process such that the periphery of the oxygen barrier film 14 is exposed, thereby forming an underlying film 24 out of the underlying-film formation film.

Figure 12C:
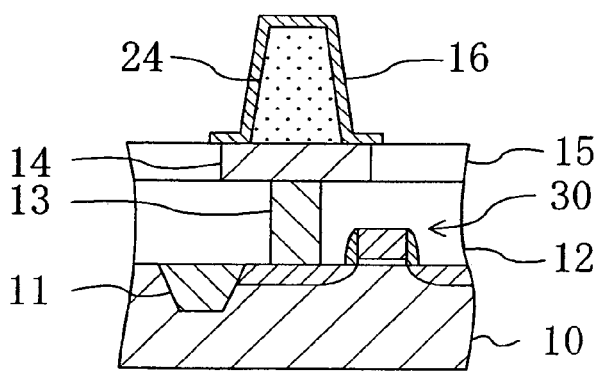

Then, as shown in FIG. 12C, a lower-electrode formation film of platinum is deposited by a sputtering or CVD process to a thickness of about 50 nm over the second interlevel dielectric film 15 to cover the underlying film 24. Thereafter, the lower-electrode formation film is patterned by a lithography process and a dry etching process, thereby forming a lower electrode 16 covering the upper and side surfaces of the underlying film 24, out of the lower-electrode formation film. In this case, a lower end portion of the lower electrode 16 is electrically connected to the oxygen barrier film 14 at the periphery of the upper surface of the oxygen barrier film 14.

Figure 12D:
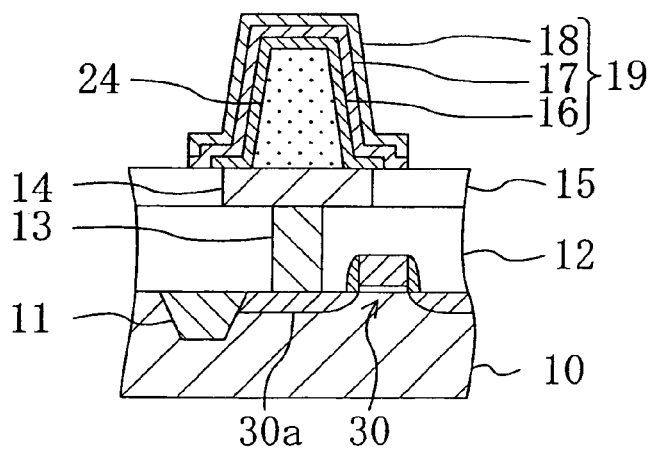

Then, as shown in FIG. 12D, a capacitive insulating film 17 having a thickness of about 50 nm and made of a ferroelectric containing strontium, bismuth, tantalum and niobium is formed by a CVD process to cover the lower electrode 16. Subsequently, an upper electrode 18 of platinum with a thickness of about 50 nm is formed through a sputtering or CVD process to cover the capacitive insulating film 17. In this case, the capacitive insulating film 17 and the upper electrode 18 are patterned using the same mask. In this manner, a capacitor 19 made of the lower electrode 16, the capacitive insulating film 17 and the upper electrode 18 is formed. In this embodiment, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the fourth embodiment, the columnar underlying film 24, which allows the lower electrode 16 to have a face perpendicular to the substrate surface, i.e., which is an auxiliary member that serves to make the structure three-dimensional, is formed on the oxygen barrier film 14. Accordingly, an excellent processability is exhibited, as compared to the case where the lower electrode 16 of platinum itself has a columnar structure.

In addition, since the underlying film 24 is formed such that the periphery of the upper surface of the oxygen barrier film 14 is exposed therefrom, an electrical connection is established between the oxygen barrier film 14 and the lower electrode 16. Thus, the underlying film 24 does not have to be made of a conductive material.

The underlying film 24 is not limited to silicon oxide, but may be made of any material that is easily processed. A material for the underlying film 24 may or may not be conductive. If conductive titanium aluminum oxide is used for the underlying film 24, the adhesion to the platinum lower electrode 16 is improved.

In the fourth embodiment, the second fabrication method for the first embodiment, i.e., the method of forming an opening in the second interlevel dielectric film 15 and filling in the opening with the oxygen barrier film 14, may also be used for the formation of the oxygen barrier film 14.

Variation of Embodiment 4

Hereinafter, a variation of the fourth embodiment of the present invention will be described with reference to the drawings.

Figure 13:
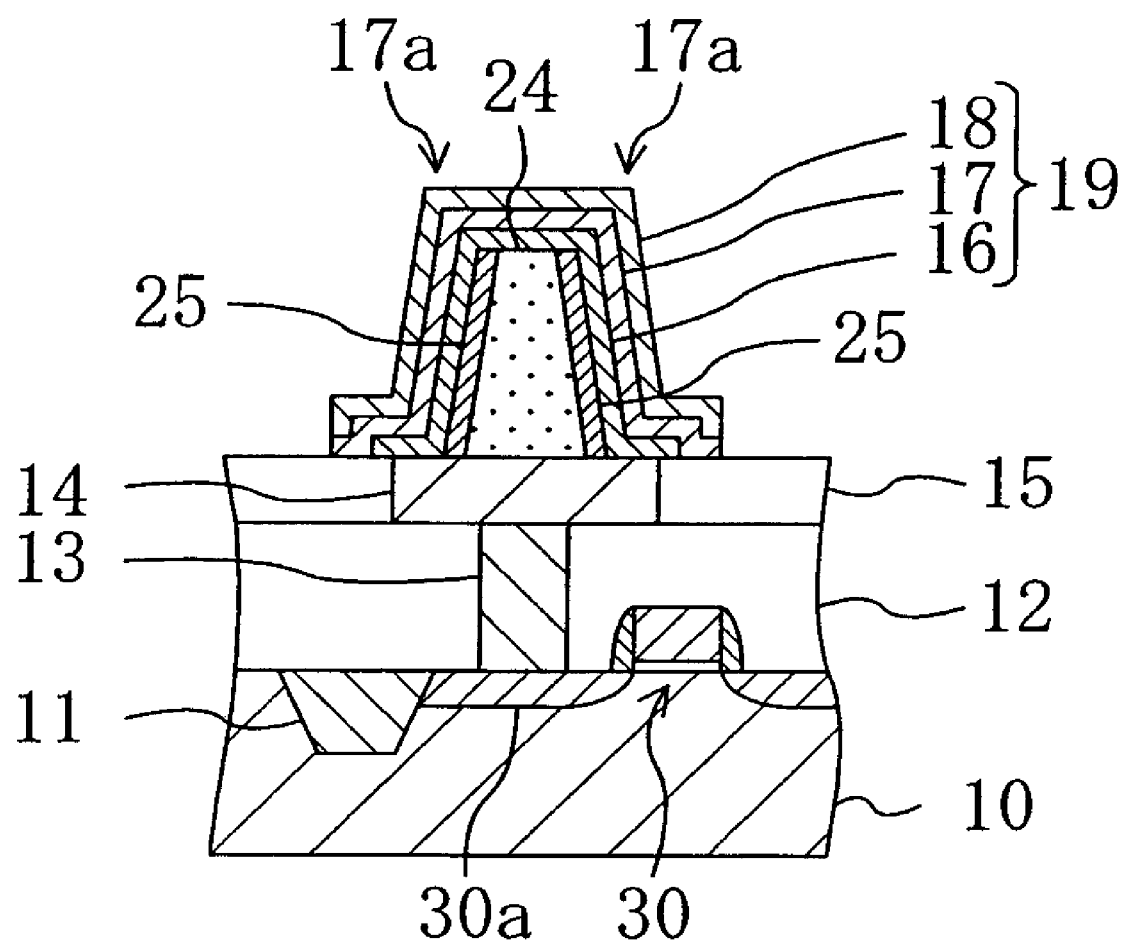
FIG. 13 is a cross-sectional view showing a structure of a semiconductor device according to a variation of the fourth embodiment.

FIG. 13 shows a cross-sectional structure of a semiconductor device according to the variation of the fourth embodiment of the present invention. In FIG. 13, each component also shown in FIG. 11 is identified by the same reference numeral and the description thereof will be omitted herein.

The semiconductor device of this variation is characterized in that an adhesion layer 25 of titanium dioxide with a thickness of about 5 nm is formed on the side surface of an underlying film 24.

The adhesion layer 25 improves the adhesion between the underlying film 24 of silicon oxide and a lower electrode 16 of platinum, so that the lower electrode 16 does not easily peel off from the underlying film 24.

Since the adhesion layer 25 is made of insulating titanium dioxide, it is necessary to form the adhesion layer 25 such that a barrier film 14 is exposed therefrom. However, if a conductive material such as iridium oxide is used, the adhesion layer 25 may cover the oxygen barrier film 14.

Hereinafter, a method for fabricating the semiconductor device thus configured will be described with reference to the drawings.

Figure 14A:
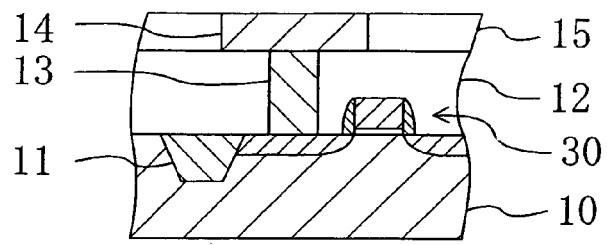
FIGS. 14A through 14D are cross-sectional views showing respective process steps in a method for fabricating the semiconductor device of the variation of the fourth embodiment

FIGS. 14A though 14D show cross-sectional structures in respective process steps of the method for fabricating the semiconductor device of the variation of the fourth embodiment. In FIGS. 14A though 14D, each component also shown in FIGS. 12A though 12D is identified by the same reference numeral.

First, as shown in FIG. 14A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole. Thereafter, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film. Thereafter, a second interlevel dielectric film 15 of silicon dioxide is deposited by a CVD process to a thickness of about 300 nm over the entire surface of the first interlevel dielectric film 12 including the oxygen barrier film 14. Then, the surface of the second interlevel dielectric film 15 is polished by a CMP process until the oxygen barrier film 14 is exposed, thereby planarizing the surfaces of the second interlevel dielectric film 15 and the oxygen barrier film 14.

Figure 14B:
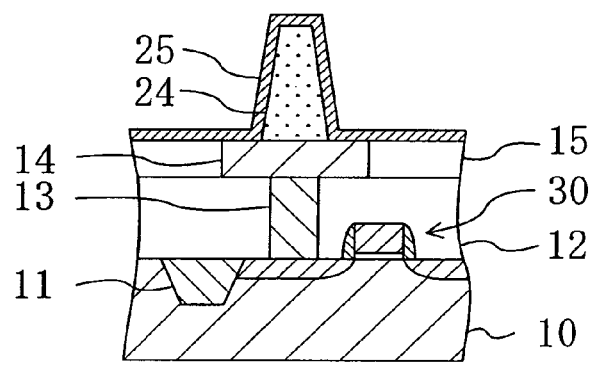

Next, as shown in FIG. 14B, an underlying-film formation film of silicon oxide is deposited by a CVD process to a thickness of about 500 nm over the entire surface of the second interlevel dielectric film 15 including the oxygen barrier film 14. Then, part of the underlying-film formation film located over the oxygen barrier film 14 is patterned by a lithography process and a dry etching process such that the periphery of the oxygen barrier film 14 is exposed, thereby forming an underlying film 24 out of the underlying-film formation film. Subsequently, a metal layer of titanium is deposited by a sputtering or CVD process to a thickness of about 5 nm over the second interlevel dielectric film 15 to cover the underlying film 24. Thereafter, the metal layer is subjected to oxidation at a temperature of about 650° C. in an oxygen atmosphere for about 60 minutes so that the metal layer is oxidized, thereby forming an adhesion layer 25 of titanium dioxide.

Figure 14C:
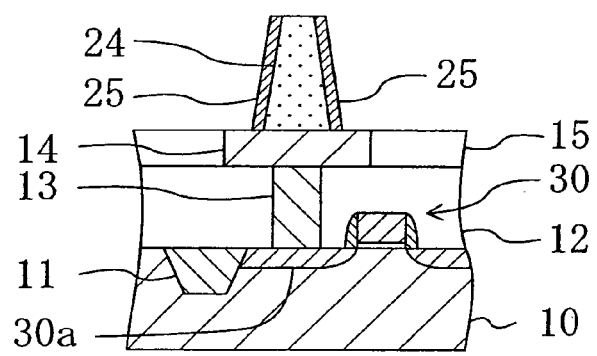

Then, as shown in FIG. 14C, the adhesion layer 25 is etched back by anisotropic dry etching using, for example, a chlorine ($Cl_2$) gas such that part of the adhesion layer 25 remains on the side surface of the underlying film 24. In this case, it is also necessary to expose the periphery of the upper surface of the oxygen barrier film 14.

Figure 14D:
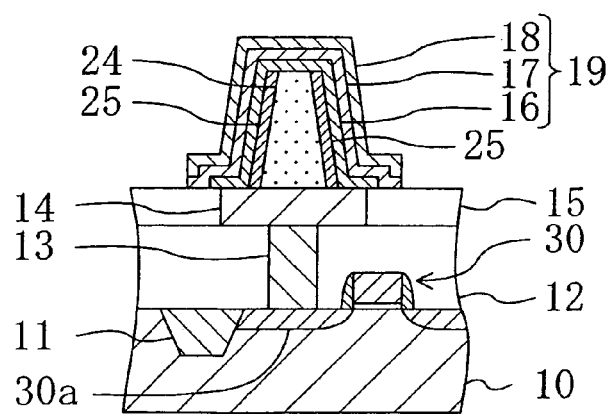

Then, as shown in FIG. 14D, a lower-electrode formation film of platinum is deposited by a sputtering or CVD process to a thickness of about 50 nm over the second interlevel dielectric film 15 as well as the underlying film 24 and the adhesion layer 25. Thereafter, the lower-electrode formation film is patterned by a lithography process and a dry etching process, thereby forming a lower electrode 16 covering the underlying film 24 with the adhesion layer 25 interposed between the lower electrode 16 and the side surface of the underlying film 24, out of the lower-electrode formation film. In this case, a lower end portion of the lower electrode 16 is electrically connected to the oxygen barrier film 14 at the periphery of the upper surface thereof. Then, a capacitive insulating film 17 having a thickness of about 50 nm and made of a ferroelectric containing strontium, bismuth, tantalum and niobium is formed by a CVD process to cover the lower electrode 16. Subsequently, an upper electrode 18 of platinum with a thickness of about 50 nm is formed through a sputtering or CVD process to cover the capacitive insulating film 17. In this case, the capacitive insulating film 17 and the upper electrode 18 are patterned using the same mask. In this manner, a capacitor 19 made of the lower electrode 16, the capacitive insulating film 17 and the upper electrode 18 is formed. In this variation, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in this variation, the adhesion layer 25 of titanium dioxide with a thickness of about 5 nm is provided on the side surface of the underlying film 24. Accordingly, it is possible to prevent the lower electrode 16 from peeling off from the underlying film 24 during the annealing for crystallizing the ferroelectric constituting the capacitive insulating film 17.

In addition, since the adhesion layer 25 is made of a metal oxide, the adhesion between the lower electrode 16 and the underlying film 24 improves due to the reaction between the adhesion layer 25 and the lower electrode 16. Moreover, diffusion of metal from the adhesion layer 25 to the capacitive insulating film 17 is prevented during annealing performed on the capacitive insulating film 17.

Furthermore, the adhesion layer 25 is formed such that the oxygen barrier film 14 is exposed therefrom as shown in FIG. 14C, and the lower electrode 16 is directly connected to the conductive oxygen barrier film 14. Accordingly, the adhesion layer 25 may or may not be conductive.

In this variation, the second fabrication method for the first embodiment, i.e., the method of forming the oxygen barrier film 14 such that an opening formed in an interlevel dielectric film is filled therewith, may also be used for the formation of the oxygen barrier film 14.

Embodiment 5

Hereinafter, a fifth embodiment of the present invention will be described with reference to the drawings.

Figure 15:
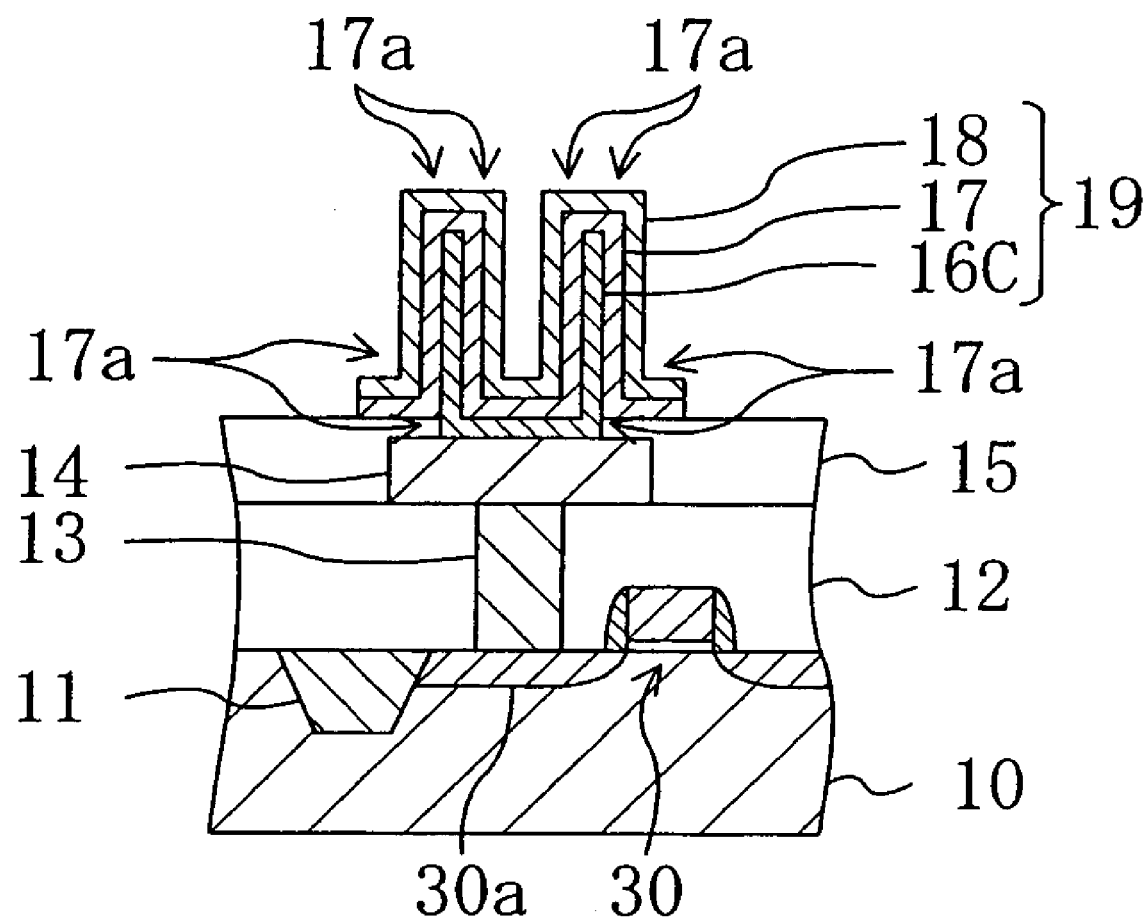
FIG. 15 is a cross-sectional view showing a structure of a semiconductor device according to a fifth embodiment of the present invention.

FIG. 15 shows a cross-sectional structure of a semiconductor device according to the fifth embodiment of the present invention. In FIG. 15, each component also shown in FIG. 1 is identified by the same reference numeral and the description thereof will be omitted herein.

As shown in FIG. 15, the semiconductor device of the fifth embodiment has a stacked cell structure in which a conductive plug 13, an oxygen barrier film 14 and a capacitor 19 are stacked perpendicularly to the substrate surface, as in the first through fourth embodiments.

The fifth embodiment is characterized in that a lower electrode 16C constituting the capacitor 19 is made of platinum in the shape of a bottomed cylinder and has a thickness of about 50 nm and a height of about 500 nm. In addition, a ferroelectric capacitive insulating film 17 and a platinum upper electrode 18 stacked thereon, which constitute the capacitor 19, are formed, following the bottom surface and the sidewall inner and outer surfaces of the lower electrode 16C.

This structure allows the capacitive insulating film 17 to have a U-bent portion 17a on contiguous bottom and wall surfaces of the bottomed-cylindrical lower electrode 16C and an inverted U-bent portion 17a over the rim of the bottomed-cylindrical lower electrode 16C. These bent portions 17a mean that the capacitive insulating film 17 has faces substantially perpendicular to the substrate surface on the sidewall inner and outer surfaces of the bottomed-cylindrical lower electrode 16C. Thus, the capacitance is remarkably increased, while the projected area of the capacitive insulating film 17 onto the substrate surface is reduced.

Hereinafter, a method for fabricating the semiconductor device thus configured will be described with reference to the drawings.

Figure 16A:
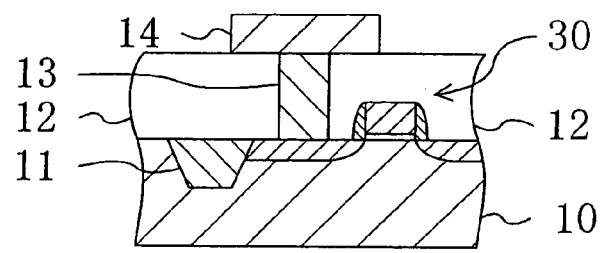
FIGS. 16A through 16D are cross-sectional views showing respective process steps in a method for fabricating the semiconductor device of the fifth embodiment

FIGS. 16A though 16D show cross-sectional structures in respective process steps of the method for fabricating the semiconductor device of the fifth embodiment. In FIGS. 16A though 16D, each component also shown in FIGS. 2A though 2D is identified by the same reference numeral.

First, as shown in FIG. 16A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole. Thereafter, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film.

Figure 16B:
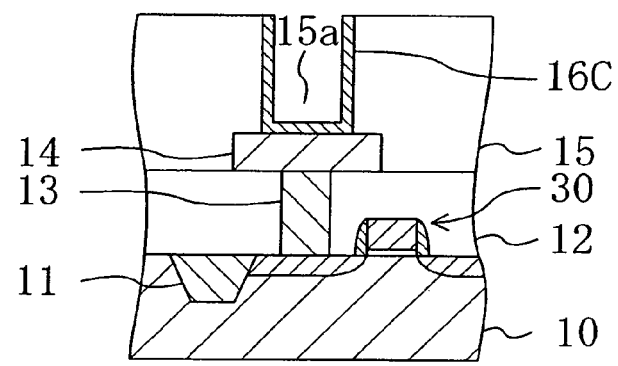

Next, as shown in FIG. 16B, a second interlevel dielectric film 15 of silicon dioxide is deposited by a CVD process to a thickness of about 1000 nm over the entire surface of the first interlevel dielectric film 12 including the oxygen barrier film 14. Then, the surface of the second interlevel dielectric film 15 is planarized so that the thickness thereof is about 500 nm. Thereafter, an opening 15a for exposing the oxygen barrier film 14 therein is formed by a lithography process and a dry etching process in the second interlevel dielectric film 15, and then a lower-electrode formation film of platinum is deposited by a sputtering or CVD process to a thickness of about 50 nm over the second interlevel dielectric film 15 including the opening 15a. Thereafter, part of the lower-electrode formation film located on the second interlevel dielectric film 15 is removed so that part of the lower-electrode formation film remains on the bottom and wall surfaces of the opening 15a, thereby forming a lower electrode 16C in the shape of a bottomed cylinder out of the lower-electrode formation film.

Figure 16C:
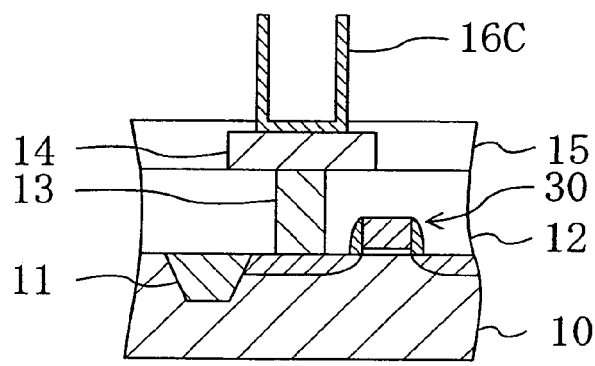

Next, as shown in FIG. 16C, part of the second interlevel dielectric film 15 is removed by etching using hydrofluoric acid vapor until the surface thereof is lowered to substantially the same level as that of the upper surface of the oxygen barrier film 14, thereby exposing the bottom surface of and sidewall inner and outer surfaces of the lower electrode 16C.

Figure 16D:
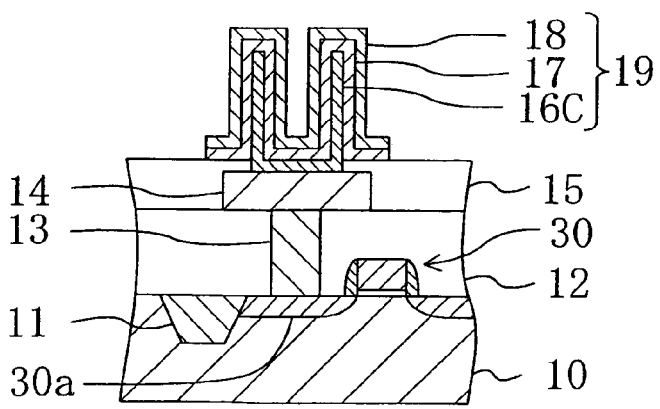

Then, as shown in FIG. 16D, a capacitive insulating film 17 having a thickness of about 50 nm and made of a ferroelectric containing strontium, bismuth, tantalum and niobium is formed by a CVD process on the second interlevel dielectric film 15 to cover the exposed bottom surface and sidewall inner and outer surfaces of the lower electrode 16C. Subsequently, an upper electrode 18 of platinum with a thickness of about 50 nm is formed through a sputtering or CVD process on the capacitive insulating film 17, following the surface of the capacitive insulating film 17. In this case, the capacitive insulating film 17 and the upper electrode 18 are patterned using the same mask. In this manner, a capacitor 19 made of the lower electrode 16C, the capacitive insulating film 17 and the upper electrode 18 is formed. In this embodiment, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the fabrication method in the fifth embodiment, part of the second interlevel dielectric film 15 is etched and removed until the surface of the second interlevel dielectric film 15 is lowered to substantially the same level as that of the upper surface of the oxygen barrier film 14. Thus, the capacitive insulating film 17 and the upper electrode 18 can also be formed on the sidewall outer surface of the lower electrode 16C.

Embodiment 6

Hereinafter, a sixth embodiment of the present invention will be described with reference to the drawings.

Figure 17:
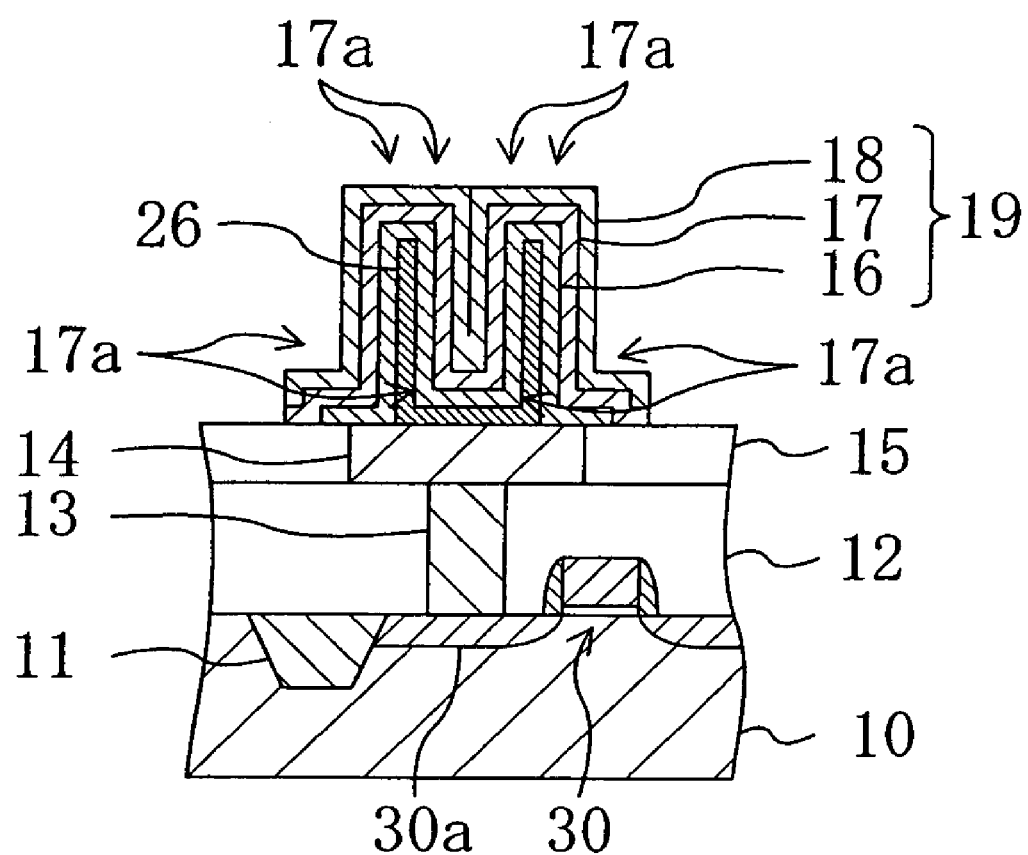
FIG. 17 is a cross-sectional view showing a structure of a semiconductor device according to a sixth embodiment of the present invention.

FIG. 17 shows a cross-sectional structure of a semiconductor device according to the sixth embodiment of the present invention. In FIG. 17, each component also shown in FIG. 1 is identified by the same reference numeral and the description thereof will be omitted herein.

As shown in FIG. 17, the semiconductor device of the sixth embodiment has a stacked cell structure in which a conductive plug 13, an oxygen barrier film 14 and a capacitor 19 are stacked perpendicularly to the substrate surface, as in the first through fifth embodiments.

The sixth embodiment is characterized in that a lower electrode 16 constituting the capacitor 19 is formed and follows the bottom surface of and sidewall outer and inner surfaces of a shape-sustaining film 26 of titanium oxide that is in the shape of a bottomed cylinder and has a thickness of about 20 nm and a height of about 500 nm. In addition, an end portion of the lower electrode 16 is electrically connected to the periphery of the upper surface of the oxygen barrier film 14. Further, a ferroelectric capacitive insulating film 17 and a platinum upper electrode 18 stacked thereon that constitute the capacitor 19 are formed, following the lower electrode 16.

This structure allows the capacitive insulating film 17 to have a U-bent portion 17a over contiguous bottom and cylindrical wall surfaces of the bottomed-cylindrical shape-sustaining film 26 and an inverted U-bent portion 17a over the rim of the bottomed-cylindrical shape-sustaining film 26. These bent portions 17a mean that the capacitive insulating film 17 has faces substantially perpendicular to the substrate surface on the sidewall inner and outer surfaces of the bottomed-cylindrical shape-sustaining film 26. Thus, the capacitance is remarkably increased, while the projected area of the capacitive insulating film 17 onto the substrate surface is reduced. In addition, the range of choice of a material for the bottomed cylinder is extended as compared to the case where the bottomed cylinder is the lower electrode 16. Therefore, by selecting a material which is stable in shape during processing, the shape of the bottomed cylinder is stabilized.

The shape-sustaining film 26 may or may not be conductive so long as the film 26 exhibits excellent adhesion to the oxygen barrier film 14 and high hardness.

Hereinafter, a method for fabricating the semiconductor device thus configured will be described with reference to the drawings.

Figure 18A:
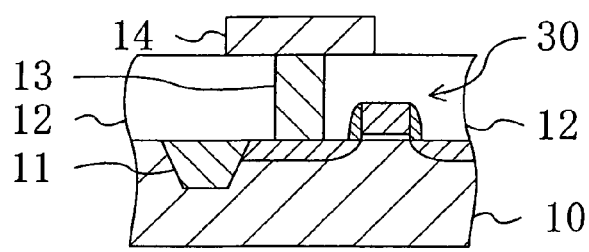
FIGS. 18A through 18D are cross-sectional views showing respective process steps in a method for fabricating the semiconductor device of the sixth embodiment

FIGS. 18A though 18D show cross-sectional structures in respective process steps of the method for fabricating the semiconductor device of the sixth embodiment. In FIGS. 18A though 18D, each component also shown in FIGS. 2A though 2D is identified by the same reference numeral.

First, as shown in FIG. 18A, as in the first fabrication method for the first embodiment, a first interlevel dielectric film 12 of silicon dioxide is deposited to a thickness of about 1000 nm over the entire surface of a semiconductor substrate 10 including an MOS transistor 30. Subsequently, the surface of the first interlevel dielectric film 12 is planarized by a CMP process so that the thickness thereof is about 500 nm. Then, a contact hole is selectively formed in part of the first interlevel dielectric film 12 located over a source region 30a of the MOS transistor 30. Subsequently, a conductive plug 13 made of a barrier layer and tungsten is formed in the contact hole. Thereafter, titanium aluminum nitride, iridium and iridium dioxide are deposited in this order by a sputtering process each to a thickness of about 50 nm over the first interlevel dielectric film 12 including the conductive plug 13, thereby forming an oxygen-barrier formation film. Subsequently, the oxygen-barrier formation film is patterned by a lithography process and a dry etching process in a region including the conductive plug 13, thereby forming an oxygen barrier film 14 out of the oxygen-barrier formation film.

Figure 18B:
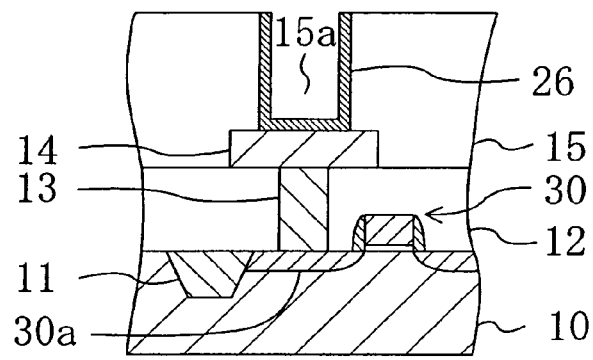

Next, as shown in FIG. 18B, a second interlevel dielectric film 15 of silicon dioxide is deposited by a CVD process to a thickness of about 1000 nm over the entire surface of the first interlevel dielectric film 12 as well as the oxygen barrier film 14. Then, the surface of the second interlevel dielectric film 15 is planarized by a CMP process so that the thickness thereof is about 500 nm. Thereafter, an opening 15a for exposing a center part of the upper surface of the oxygen barrier film 14 therein is formed by a lithography process and a dry etching process in the second interlevel dielectric film 15. Subsequently, a metal film of titanium is deposited by a sputtering or CVD process to a thickness of about 10 nm over the second interlevel dielectric film 15 including the opening 15a. The metal film is subjected to oxidation at a temperature of about 650° C. in an oxygen atmosphere for about 60 minutes so that the metal film is oxidized, thereby forming a shape-sustaining-film formation film. Then, part of the shape-sustaining-film formation film located on the second interlevel dielectric film 15 is removed by a CMP process on a resist etch back process so that part of the shape-sustaining-film formation film remains on the bottom and wall surfaces of the opening 15a, thereby forming a shape-sustaining film 26 in the shape of a bottomed cylinder, out of the shape-sustaining-film formation film.

Figure 18C:
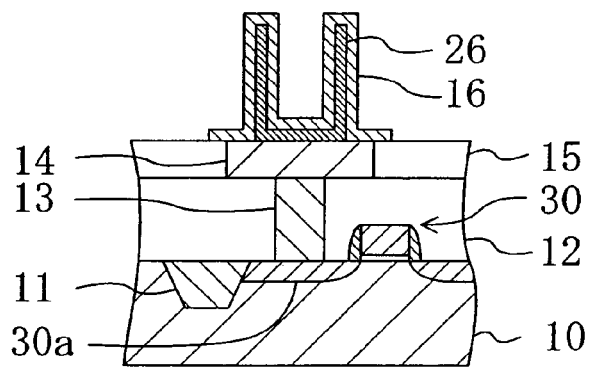

Then, as shown in FIG. 18C, part of the second interlevel dielectric film 15 is removed by etching using hydrofluoric acid vapor so that the periphery of the upper surface of the oxygen barrier film 14 is exposed, thereby exposing the sidewall outer surface of the shape-sustaining film 26. Thereafter, a lower-electrode formation film of platinum is deposited by a sputtering or CVD process to a thickness of about 50 nm over the second interlevel dielectric film 15 so as to cover the exposed bottom surface and sidewall inner and outer surfaces of the shape-sustaining film 26. Subsequently, the lower-electrode formation film is patterned by a lithography process and a dry etching process in a region including the shape-sustaining film 26, thereby forming a lower electrode 16 whose end portion is connected to the periphery of the upper surface of the oxygen barrier film 14, out of the lower-electrode formation film.

Figure 18D:
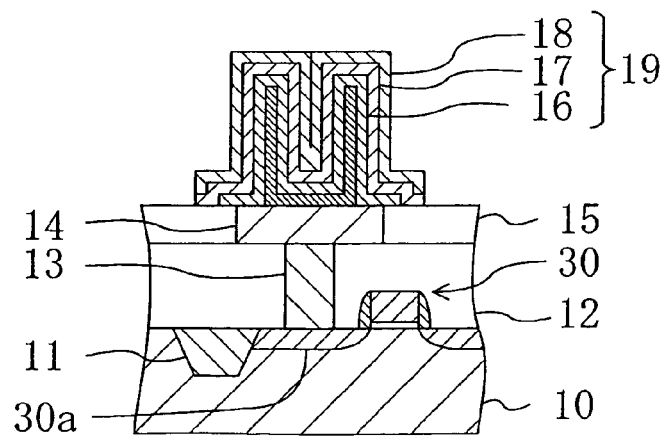
Figure 19A:
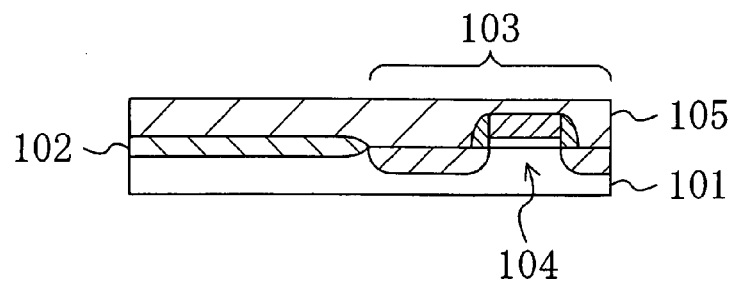
FIGS. 19A through 19D are cross-sectional views showing respective process steps in a method for fabricating a known semiconductor device.
Figure 19B:
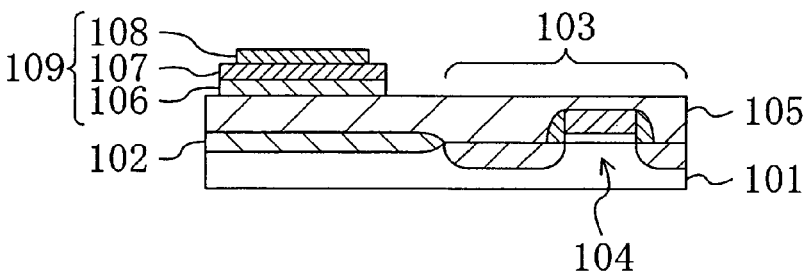
Figure 19C:
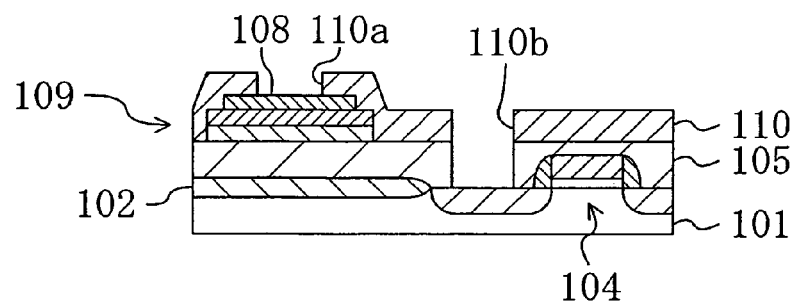
Figure 19D:
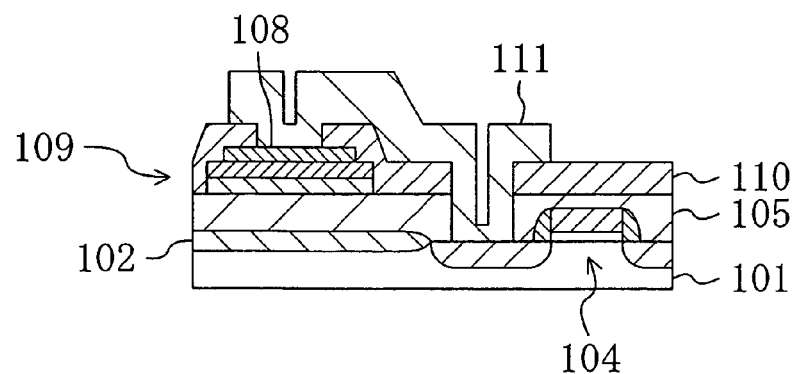

Then, as shown in FIG. 18D, a capacitive insulating film 17 having a thickness of about 50 nm and made of a ferroelectric containing strontium, bismuth, tantalum and niobium is formed by a CVD process on the second interlevel dielectric film 15 to cover the exposed surface of the lower electrode 16. Subsequently, an upper electrode 18 of platinum with a thickness of about 50 nm is formed through a sputtering or CVD process on the capacitive insulating film 17, following the surface of the capacitive insulating film 17. In this case, the capacitive insulating film 17 and the upper electrode 18 are patterned using the same mask. In this manner, a capacitor 19 made of the lower electrode 16, the capacitive insulating film 17 and the upper electrode 18 is formed. In this embodiment, annealing is also performed at a temperature of about 700° C. for about 10 minutes so as to crystallize the ferroelectric constituting the capacitive insulating film 17.

Thereafter, though not shown, a required wiring, for example, is formed over the semiconductor substrate 10, and then a passivation film is formed.

As described above, in the fabrication method in the sixth embodiment, part of the second interlevel dielectric film 15 is etched and removed until the upper surface of the oxygen barrier film 14 is exposed therefrom. Thus, the lower electrode 16, the capacitive insulating film 17 and the upper electrode 18 can also be formed on the sidewall outer surface of the shape-sustaining film 26. In addition, an electrical continuity is established between the lower electrode 16 and the oxygen barrier film 14.

Since the shape-sustaining film 26 is made of a metal oxide, the adhesion to the lower electrode 16 improves due to the reaction between the shape-sustaining film 26 and the lower electrode 16. In addition, diffusion of metal from the shape-sustaining film 26 to the capacitive insulating film 17 is prevented during annealing performed on the capacitive insulating film 17.

In the first through sixth embodiments, the capacitive insulating film is made of a ferroelectric. However, the capacitive insulating film is not limited to a ferroelectric but may be made of a high-κ or paraelectric material.

What is claimed is:

1. A method for fabricating a semiconductor device, comprising the steps of:
   a) forming a first interlevel dielectric film on a semiconductor region;
   b) forming, in the first interlevel dielectric film, a conductive plug connected to the semiconductor region;
   c) after the step b, forming, on the first interlevel dielectric film, a second interlevel dielectric film having a first opening in which the conductive plug is exposed;
   d) forming a conductive oxygen barrier film in the first opening such that the conductive oxygen barrier film fills in the first opening and then planarizing a surface of the second interlevel dielectric film and a surface of the buried conductive oxygen barrier film so that the surfaces will be at substantially the same level;
   e) forming, on the second interlevel dielectric film, a third interlevel dielectric film having a second opening in which the oxygen barrier film is exposed;
   f) forming a lower electrode on bottom and wall surfaces of the second opening formed in the third interlevel dielectric film such that the lower electrode is connected to the oxygen barrier film;
   g) forming a capacitive insulating film on the lower electrode such that the capacitive insulating film follows the lower electrode; and
   h) forming an upper electrode on the capacitive insulating film such that the upper electrode follows the capacitive insulating film.

2. The method of claim 1, wherein the step f) includes the step of removing part of the lower electrode located on the third interlevel dielectric film.

3. The method of claim 1, including the step of forming, on parts of the third interlevel dielectric film respectively located on the bottom and wall surfaces of the second opening, an adhesion layer that is connected to the oxygen barrier film and enhances the adhesion of the lower electrode to the third interlevel dielectric film, between the steps of e) and f).

4. The method of claim 1, including the step of forming, on part of the third interlevel dielectric film located an the wall of the second opening, an adhesion layer that enhances the adhesion of the lower electrode to the third interlevel dielectric film, between the steps of e) and f).

5. The method of claim 4, wherein the adhesion layer is made of a metal oxide.

6. The method of claim 1, wherein the capacitive insulating film is made of a ferroelectric or a high-dielectric-constant material.

7. A method for fabricating a semiconductor device, comprising the steps of:
   a) forming a first interlevel dielectric film ant semiconductor region;
   b) forming in the first interlevel dielectric film, a conductive plug connected to the semiconductor region;
   c) forming a conductive oxygen barrier film on the first interlevel dielectric film such that the conductive oxygen barrier film covers the conductive plug;
   d) forming a second interlevel dielectric film on the first interlevel dielectric film and the conductive oxygen barrier film and then planarizing the second interlevel dielectric film such that the oxygen barrier film is exposed from the second interlevel dielectric film;
   e) forming, on the exposed oxygen barrier film, a lower electrode having a relatively large thickness;
   f) forming a capacitive insulating film on upper and side surfaces of the lower electrode; and
   g) forming an upper electrode on the capacitive insulating film such that the upper electrode follows the capacitive insulating film.

8. The method of claim 7, wherein the capacitive insulating film is made of a ferroelectric or a high-dielectric-constant material.

9. A method for fabricating a semiconductor device, comprising the steps of:
   a) forming a first interlevel dielectric film on a semiconductor region;
   b) forming, in the first interlevel dielectric film, a conductive plug connected to the semiconductor region;
   c) forming a conductive oxygen barrier film on the first interlevel dielectric film such that the conductive oxygen barrier film covers the conductive plug;
   d) forming a second interlevel dielectric film on the first interlevel dielectric film and the conductive oxygen barrier film and then planarizing the second interlevel dielectric film such that the oxygen barrier film is exposed from the second interlevel dielectric film;
   e) forming, on the exposed oxygen barrier film, an underlying film having a relatively large thickness;
   f) forming a lower electrode on upper and side surfaces of the underlying film such that an end portion of the lower electrode is connected to the oxygen barrier film;
   g) forming a capacitive insulating film on the lower electrode such that the capacitive insulating film follows the lower electrode; and
   h) forming an upper electrode on the capacitive insulating film such that the upper electrode follows the capacitive insulating film.

10. The method of claim 9, including the step of forming, on the surface of the underlying film, an adhesion layer that enhances the adhesion of the lower electrode to the underlying film, between the steps of e) and f).

11. The method of claim 9, wherein the capacitive insulating film is made of a ferroelectric or a high-dielectric-constant material.

12. A method for fabricating a semiconductor device, comprising the steps of:
   a) forming a first interlevel dielectric film on a semiconductor region;
   b) forming, in the first interlevel dielectric film, a conductive plug connected to the semiconductor region;
   c) forming a conductive oxygen barrier film on the first interlevel dielectric film such that the conductive oxygen barrier film covers the conductive plug;
   d) forming a second interlevel dielectric film over the entire surface of the first interlevel dielectric film including the oxygen barrier film and then forming, in the second interlevel dielectric film, an opening in which the oxygen barrier film is exposed;
   e) depositing a conductive film on bottom and wall surfaces of the opening formed in the second interlevel dielectric film, thereby forming, on the oxygen barrier film, a lower electrode in the shape of a bottomed cylinder made of the conductive film and connected to the oxygen barrier film;
   f) removing part of the second interlevel dielectric film to expose the lower electrode except at a bottom portion of a sidewall outer surface on the oxygen barrier film and then forming a capacitive insulating film such that the capacitive insulating film follows sidewall inner and outer surfaces of the exposed lower electrode; and
   g) forming an upper electrode on the capacitive insulating film so that the upper electrode follows the capacitive insulating film.

13. The method of claim 12, wherein the capacitive insulating film is made of a ferroelectric or a high-dielectric-constant material.

14. A method for fabricating a semiconductor device, comprising the steps of:
  a) forming a first interlevel dielectric film on a semiconductor region;
  b) forming, in the first interlevel dielectric film, a conductive plug connected to the semiconductor region;
  c) forming a conductive oxygen barrier film on the first interlevel dielectric film such tat the conductive oxygen barrier film covers the conductive plug;
  d) forming a second interlevel dielectric film over the entire surface of the first interlevel dielectric film including the oxygen barrier film and ten forming, in the second interlevel dielectric film, an opening in which the oxygen barrier film is exposed;
  e) forming a shape-sustaining film in the shape of a bottomed cylinder on bottom and wall surfaces of the opening formed in the second interlevel dielectric film;
  f) removing part of the second interlevel dielectric film to entirely expose a sidewall outer surface of the shape-sustaining film on the oxygen barrier film, and then forming a lower electrode such that the lower electrode follows the sidewall outer surface of, and a sidewall inner surface of, the exposed shape-sustaining film and that an end portion of the lower electrode is connected to the oxygen barrier film;
  g) forming a capacitive insulating film on the lower electrode such that the capacitive insulating film follows the lower electrode; and
  h) forming an upper electrode on the capacitive insulating film such that the upper electrode follows the capacitive insulating film.

15. The method of claim 14, wherein the shape-sustaining film is made of a metal oxide.

16. The method of claim 14, wherein the capacitive insulating film is made of a ferroelectric or a high-dielectric-constant material.

* * * * *